United States Patent
Khaderbad et al.

(10) Patent No.: US 12,255,239 B2
(45) Date of Patent: Mar. 18, 2025

(54) LINER LAYER FOR BACKSIDE CONTACTS OF SEMICONDUCTOR DEVICES

(71) Applicant: Taiwan Semiconductor Manufacturing Co., Ltd., Hsinchu (TW)

(72) Inventors: Mrunal Abhijith Khaderbad, Hsinchu (TW); Keng-Chu Lin, Ping-Tung (TW); Yu-Yun Peng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 780 days.

(21) Appl. No.: 17/377,519

(22) Filed: Jul. 16, 2021

(65) Prior Publication Data

US 2023/0015572 A1    Jan. 19, 2023

(51) Int. Cl.
  *H01L 29/417*    (2006.01)
  *H01L 29/06*     (2006.01)
  *H01L 29/40*     (2006.01)
  *H01L 29/423*    (2006.01)
  *H01L 29/66*     (2006.01)
  *H01L 29/786*    (2006.01)

(52) U.S. Cl.
  CPC ...... *H01L 29/4175* (2013.01); *H01L 29/0673* (2013.01); *H01L 29/401* (2013.01); *H01L 29/42392* (2013.01); *H01L 29/665* (2013.01); *H01L 29/78696* (2013.01)

(58) Field of Classification Search
  CPC ............. H01L 29/665; H01L 29/42392; H01L 29/4175; H01L 29/0673; H01L 29/401; H01L 29/78696
  See application file for complete search history.

(56) References Cited

U.S. PATENT DOCUMENTS 9,105,490 B2   8/2015  Wang et al.
9,236,267 B2   1/2016  De et al.
(Continued)

FOREIGN PATENT DOCUMENTS

CN    113053820 A  *  6/2021  ....... H01L 21/76897

OTHER PUBLICATIONS

Mallikarjunan, Silicon Precursor Development for Advanced Dielectric Barriers for VLSI Technology, 2011 (Year: 2011).*

(Continued)

*Primary Examiner* — Syed I Gheyas
*Assistant Examiner* — Casey Paul Boatman
(74) *Attorney, Agent, or Firm* — Sterne, Kessler, Goldstein & Fox P.L.L.C.

(57) ABSTRACT

The present disclosure describes a semiconductor device that includes a transistor. The transistor includes a source/drain region that includes a front surface and a back surface opposite to the front surface. The transistor includes a salicide region on the back surface and a channel region in contact with the source/drain region. The channel region has a front surface co-planar with the front surface of the source/drain region. The transistor further includes a gate structure disposed on a front surface of the channel region. The semiconductor device also includes a backside contact structure that includes a conductive contact in contact with the salicide region and a liner layer surrounding the conductive contact.

20 Claims, 28 Drawing Sheets

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2020/0044025 A1* | 2/2020 | Liu .................. H01L 29/66545 |
| 2021/0091179 A1* | 3/2021 | Wang ............... H01L 29/66469 |
| 2021/0098457 A1* | 4/2021 | Cheng ............ H01L 21/823821 |
| 2022/0367462 A1* | 11/2022 | Chiang ........... H01L 21/823842 |

OTHER PUBLICATIONS

Chiang, Physical and Barrier Properties of Plasma Enhanced Chemical Vapor Deposition α-SiC:N:H Films, 2003 (Year: 2003).*

Chou, Doping and electrical properties of amorphous silicon carbon nitride film, 2003 (Year: 2003).*

Gaskins, Review-Investigation and Review of the Thermal, Mechanical, Electrical, Optical, and Structural Properties of Atomic Layer Deposited High-k Dielectrics: Beryllium Oxide, Aluminum Oxide, Hafnium Oxide, and Aluminum Nitride, 2017 (Year: 2017).*

* cited by examiner

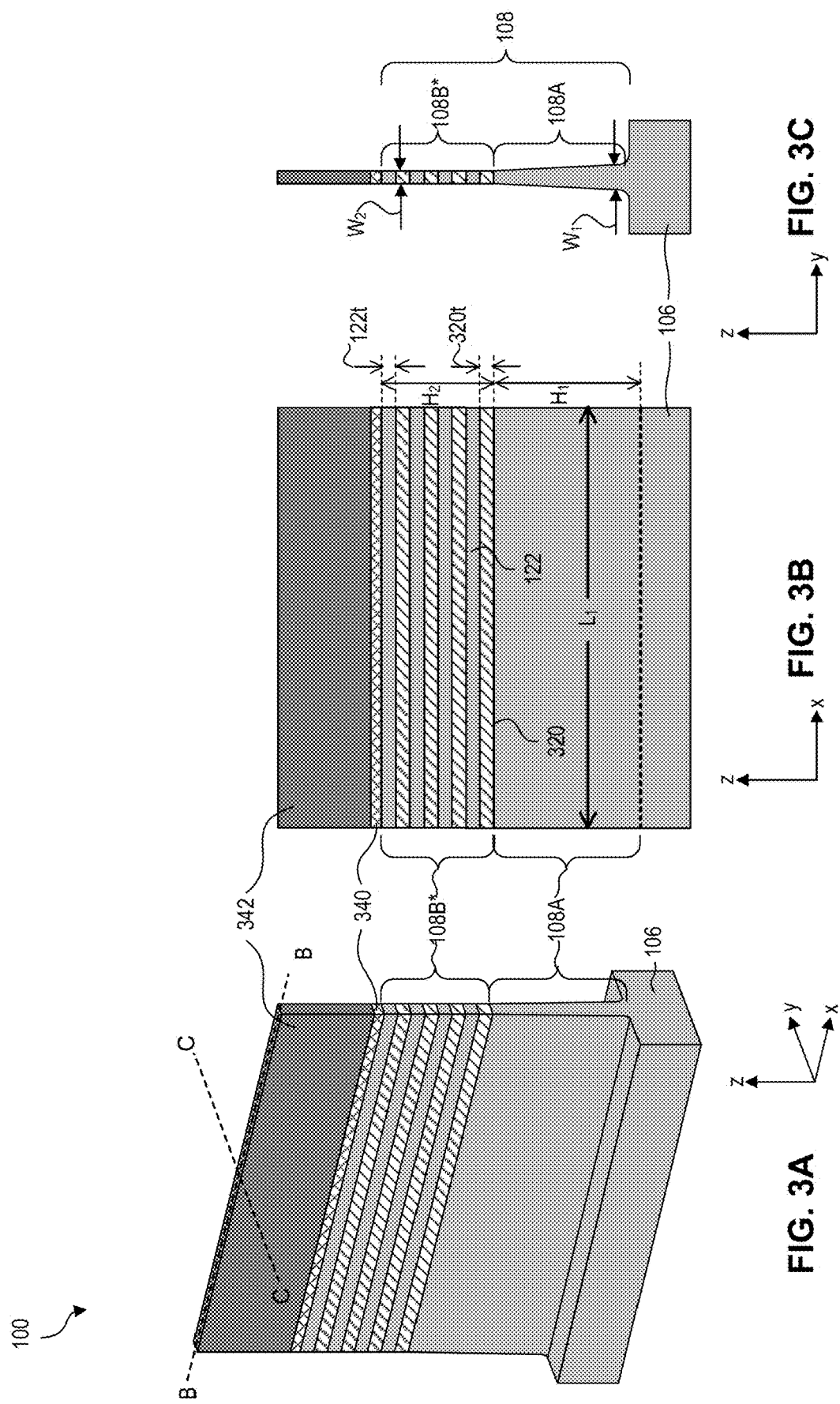

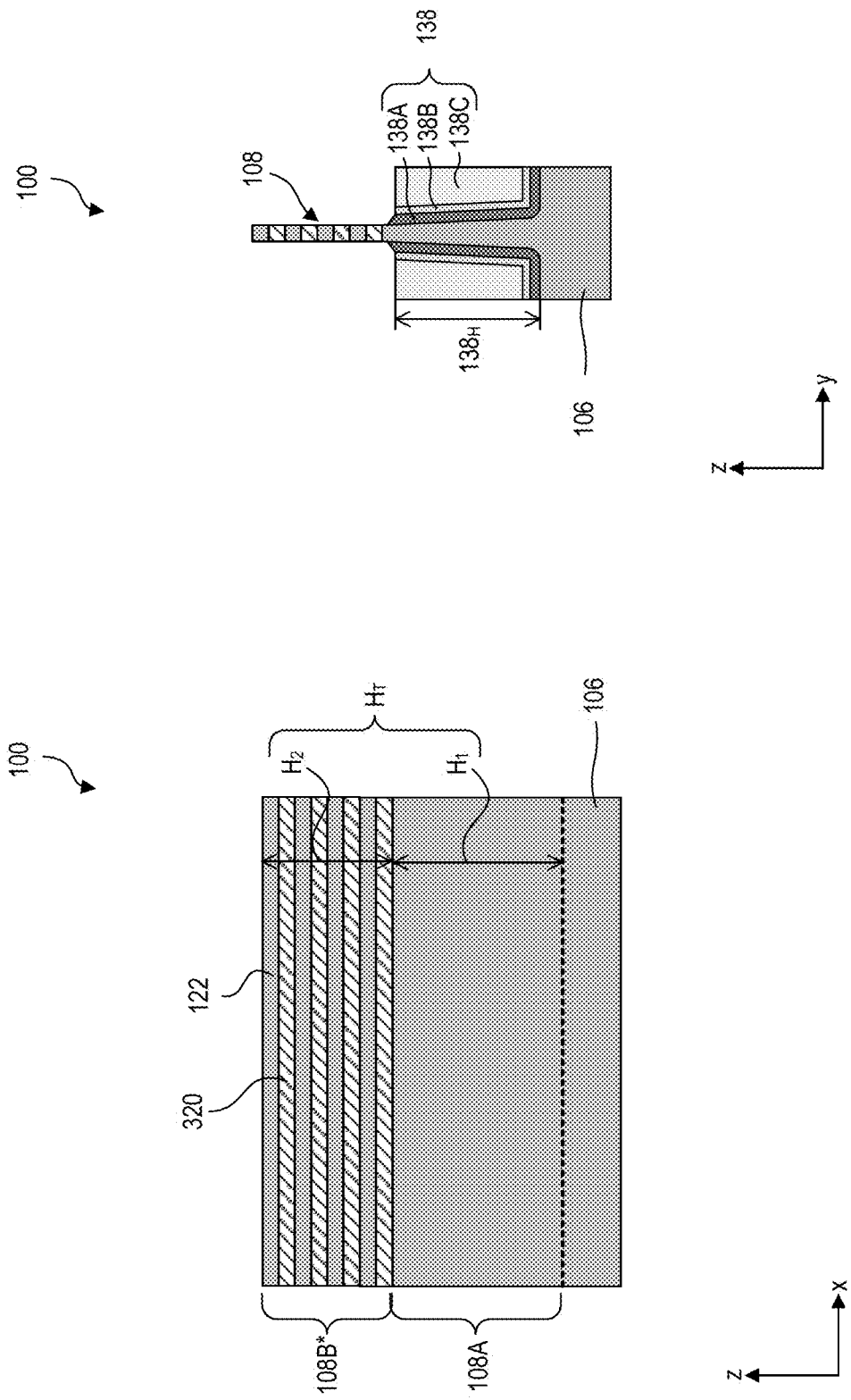

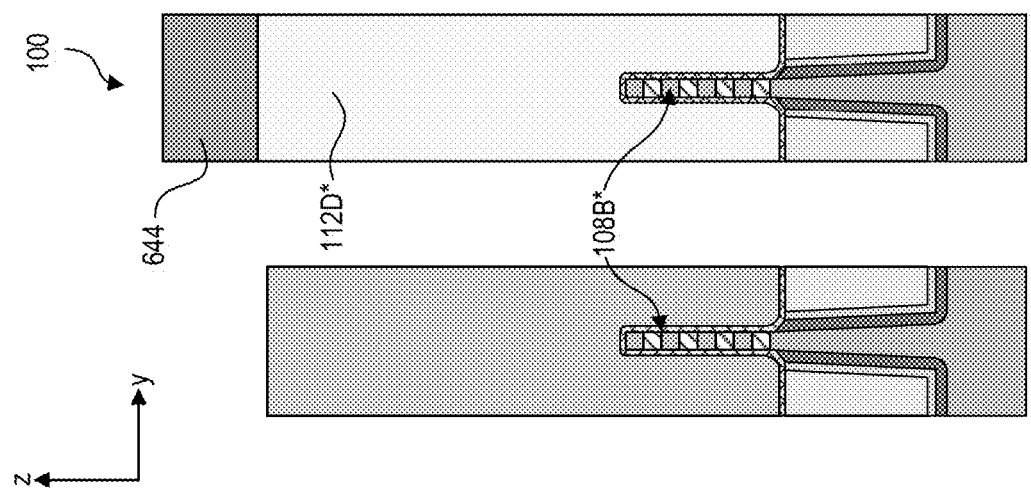
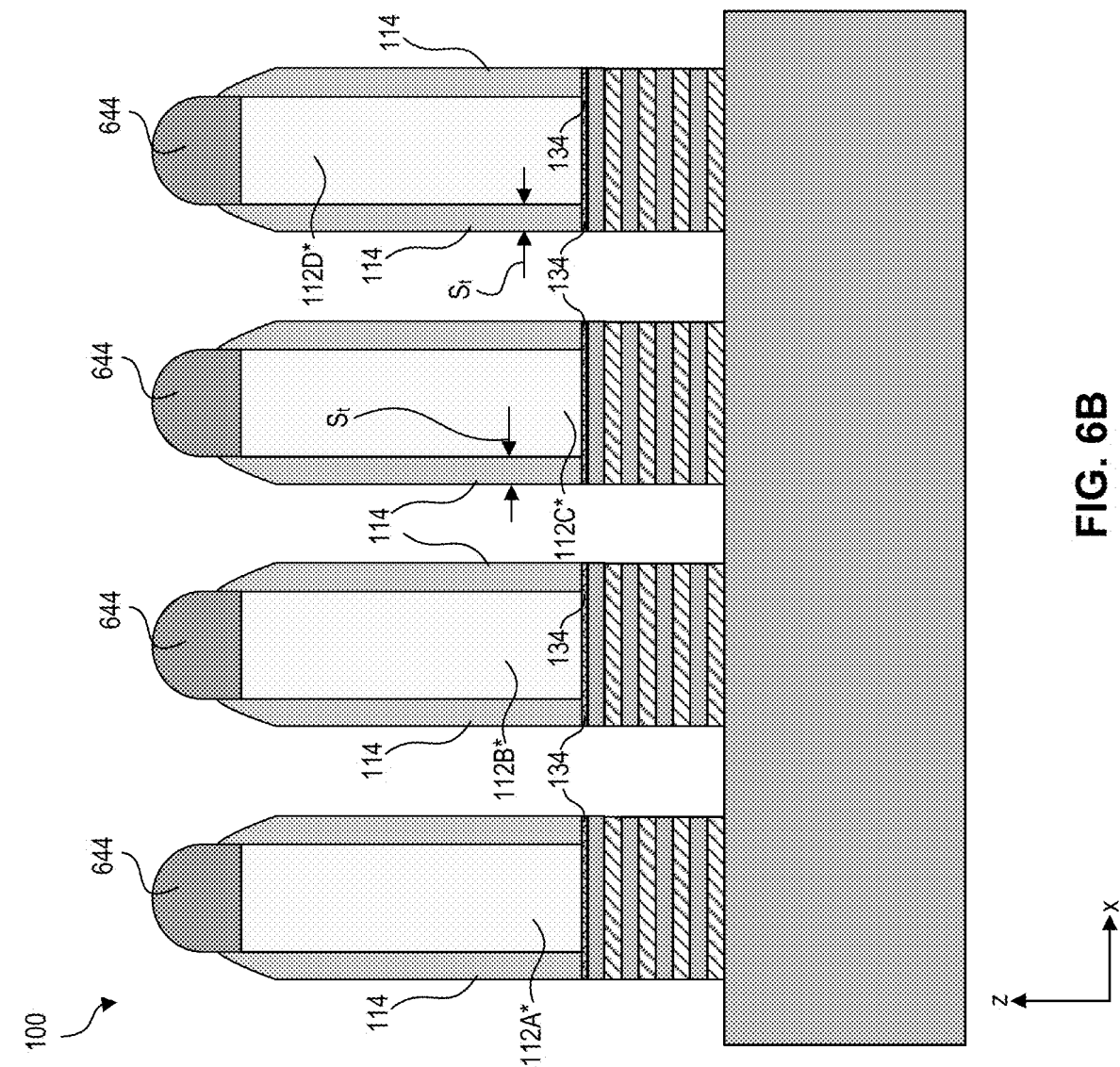
FIG. 6D
FIG. 6C
FIG. 6B

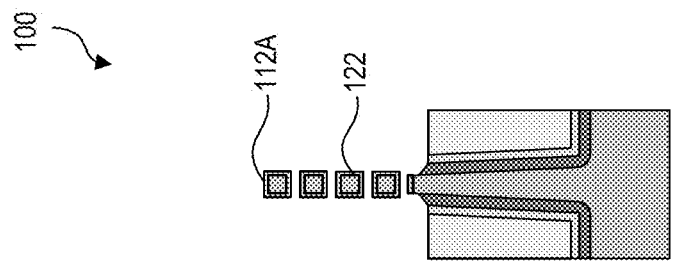
FIG. 9C
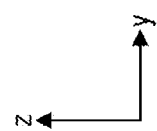
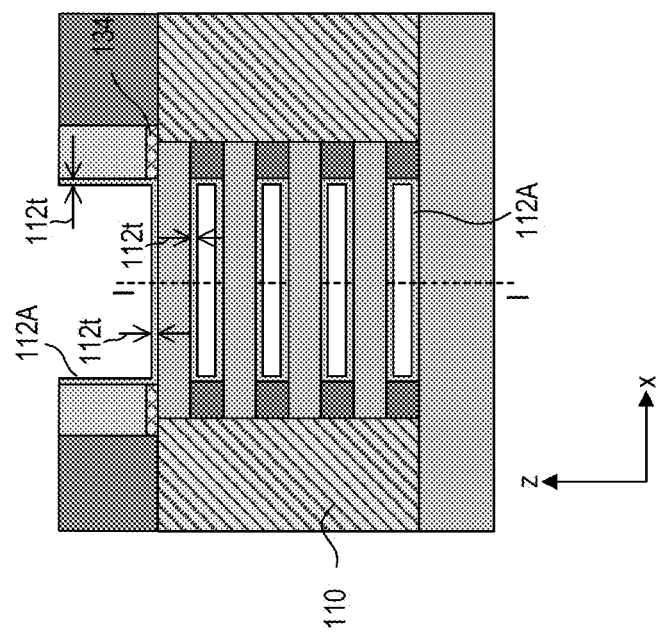
FIG. 9B

US 12,255,239 B2

LINER LAYER FOR BACKSIDE CONTACTS OF SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices and three-dimensional transistors such as gate-all-around (GAA) field effect transistors and fin field effect transistors (finFETs) are introduced.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 3A-3C, 4A-4C, 5A-5D, 6A-6D, 7A-7C, 8A-8C, and 9A-9C illustrate various views of semiconductor devices at various stages of their fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
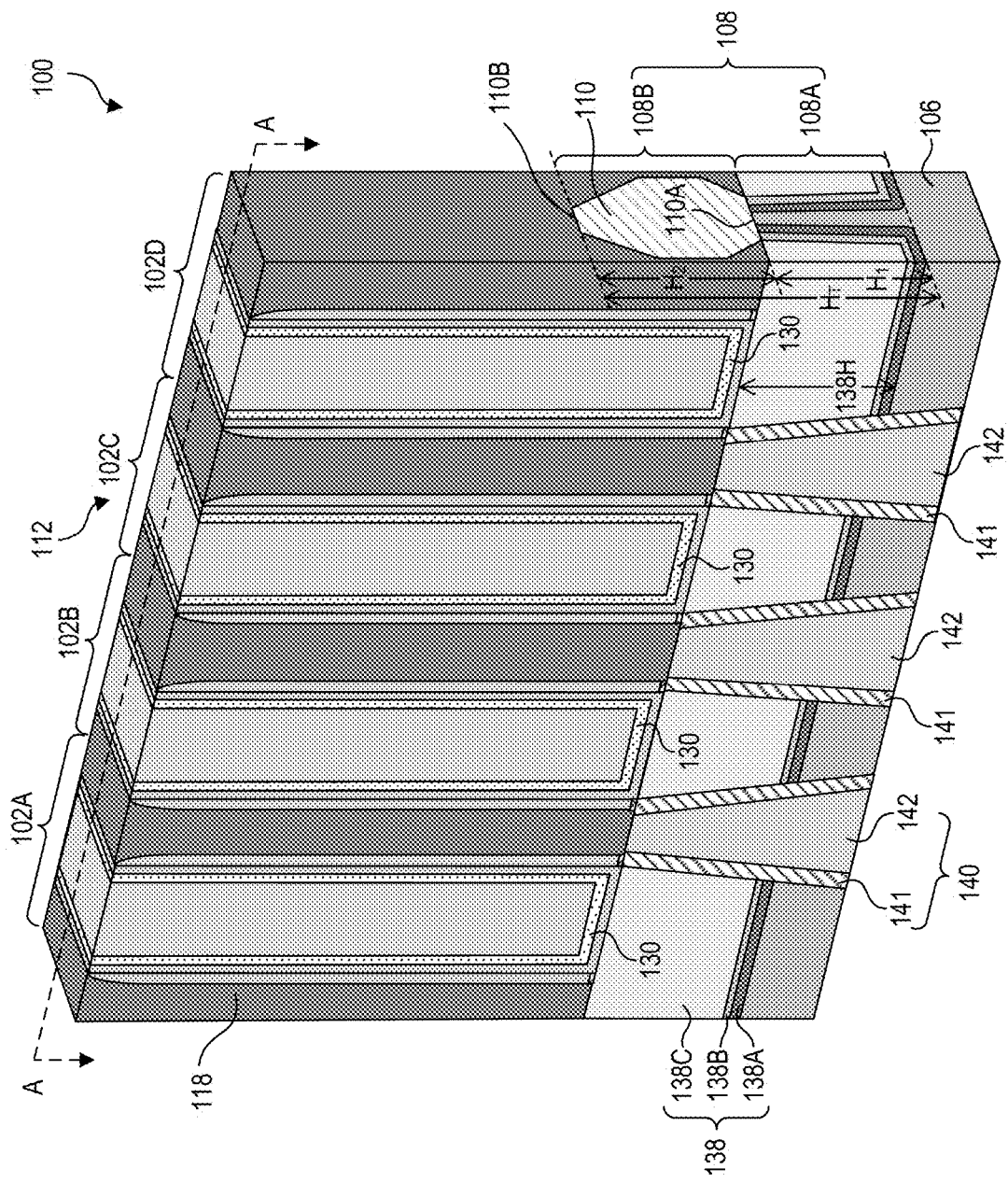
FIGS. 1A and 1B illustrate an isometric view and a cross-sectional view of a semiconductor device, respectively, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value).

The terms "vertical direction" and "horizontal direction" respectively refer to z-direction and x-direction as illustrated in the figures herein.

The present disclosure provides example field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As the semiconductor industry continues to scale down the dimensions of semiconductor devices, circuit complexity has increased at the mid-end-of-line (MEOL) and back-end-of-line (BEOL) device levels. Shrinking metal lines and narrow interconnects drastically increase resistance. Backside contacts can provide electrical connection (e.g., power supply) to transistor terminals without occupying valuable device space in the MEOL and BEOL device levels. For example, backside contacts can provide power supply to the source/drain (S/D) terminals of GAA FETs or finFETs. The backside contacts can be formed by depositing a dielectric layer on the back surface of a semiconductor substrate, forming openings to expose one or more source/drain terminals, performing a cleaning process of the exposed structures, and depositing a conductive material in the openings. The semiconductor substrate can also be thinned down prior to depositing the dielectric layer to further reduce device dimensions. Backside contacts can reduce interconnect complexity, free up device real estate, and improve device performance and reliability. However, etching openings through the backside of the semiconductor structure and performing cleaning processes can lead to material loss of spacers that are adjacent to the source/drain terminals, which in turn can cause circuit shorts and device failure.

Various embodiments in the present disclosure describe methods for forming low-temperature liner layers for backside contacts in semiconductor devices. During the fabrication of backside contacts, openings are formed through a back surface of the wafer and low-temperature liner layers are deposited in the openings. Liner layers can protect exposed structures that are in the openings during etching or cleaning processes. For example, the liner layers can be inactive against cleaning solutions that are used during cleaning or etching processes in the backside openings. Liner layers can also prevent leakage current between gate structures and source/drain terminals. Liner layers can be formed using a low-temperature deposition method (e.g., between about 300° C. and about 400° C.) to preserve thermal budget and avoid damaging existing structures, such as already-formed MEOL and BEOL structures. In some embodiments, a directional (e.g., anisotropic) etching process can be used to remove bottom portion of the liner layers and expose the source/drain terminals such that conductive material can be deposited directly on the source/drain terminals. In some embodiments, salicide (e.g., self-aligned silicide) regions can be formed at the interface of the conductive material and the source/drain terminals. Low-temperature liner layers described herein provide various benefits that can improve device performance, reliability, and yield. Benefits can include, but are not limited to, reduced contact resistance, reduced interconnect complexity, protection for spacer layer, protection for sidewalls of the openings, among other things. The embodiments described herein use GAA FETs as examples and can be applied to other semiconductor structures, such as finFETs and planar FETs. In addition, the embodiments described herein can be used in various technology nodes, such as 14 nm, 7 nm, 5 nm, 3 nm, 2 nm, and lower technology nodes.

Figure 1B:
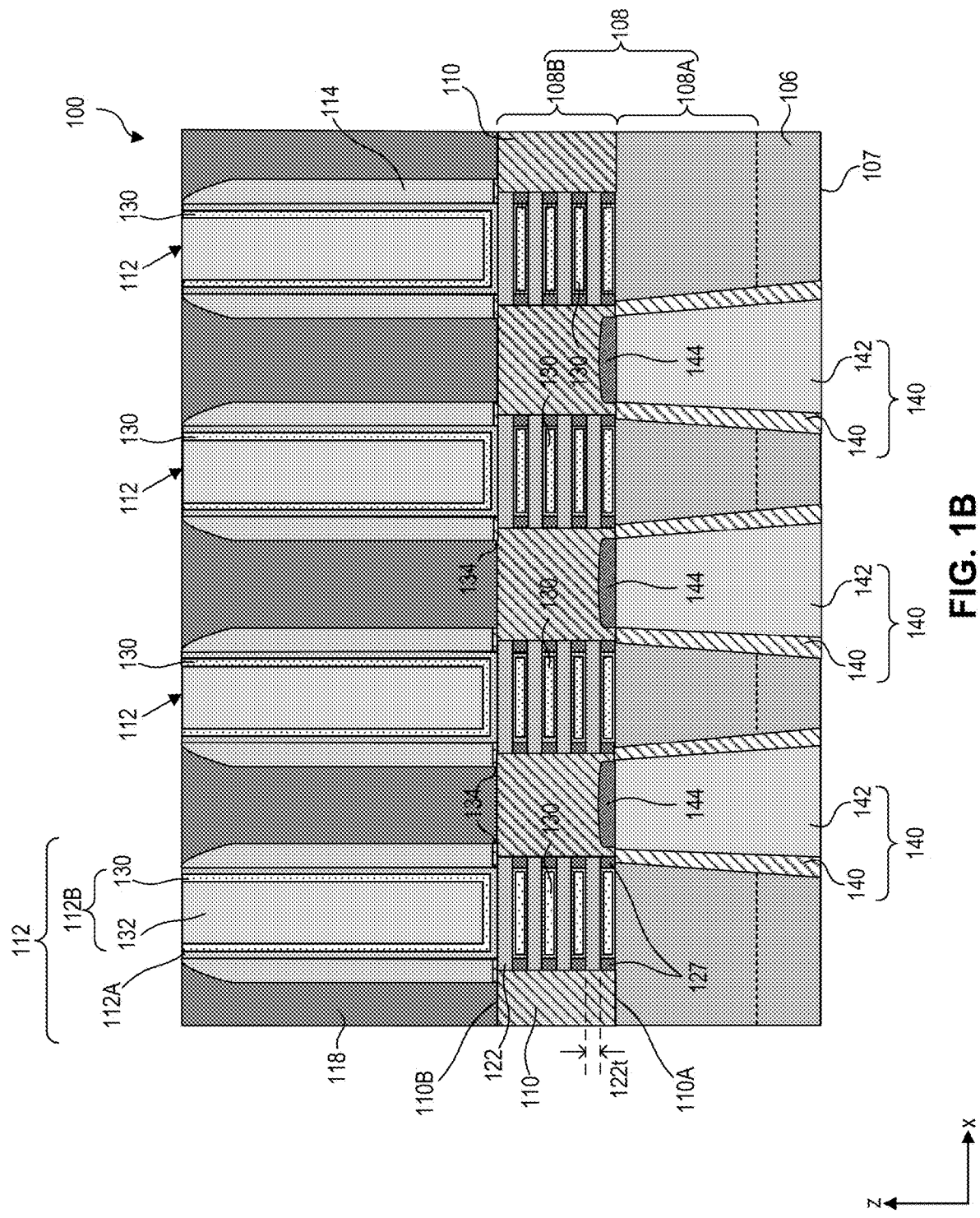

A semiconductor device 100 having finFETs 102A-102D is described with reference to FIGS. 1A and 1B, according to some embodiments. FIG. 1A illustrates an isometric view of semiconductor device 100, according to some embodiments. FIG. 1B illustrates a cross-sectional view along line A-A of semiconductor device 100 of FIG. 1A.

In some embodiments, finFETs 102A-102D can be both p-type finFETs (PFETs) or n-type finFETs (NFETs) or one of each conductivity type finFETs. For example, finFETs 102A and 102B can be NFETs and finFETs 102C and 102D can be PFETs. Though four finFETs are shown in FIGS. 1A and 1B, semiconductor device 100 can have any number of finFETs. The discussion of elements of finFETs 102A-102D with the same annotations applies to each other, unless mentioned otherwise. The isometric and cross-sectional views of semiconductor device 100 are shown for illustration purposes and may not be drawn to scale.

Referring to FIGS. 1A and 1B, finFETs 102A-102D can be formed on a substrate 106. Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Semiconductor device 100 can further include a fin structure 108 extending along an x axis and through finFETs 102A-102D. Fin structure 108 can be a part of a substrate and include a fin base portion 108A and a fin top portion 108B disposed on fin base portion 108A. In some embodiments, fin base portion 108A can include material similar to substrate 106. Fin base portion 108A can be formed from a photolithographic patterning and an etching of substrate 106. In some embodiments, fin top portion 108B can include a stack of semiconductor layers 122, which can be in the form of nanowires. Each semiconductor layer 122 can form a channel region underlying gate structures 112 of finFETs 102A-102D.

In some embodiments, semiconductor layers 122 can be a stack of nanowires that can include semiconductor materials similar to or different from substrate 106. In some embodiments, each of semiconductor layer 122 can include silicon germanium (SiGe) with germanium in a range from about 25 atomic percent to about 50 atomic percent (e.g., about 30 atomic percent, 35 atomic percent, or about 45 atomic percent) with any remaining atomic percent being silicon or can include silicon without any substantial amount of germanium.

The semiconductor materials of semiconductor layers 122 can be undoped or can be in-situ doped during their epitaxial growth process using: (i) p-type dopants, such as boron, indium, and gallium; and/or (ii) n-type dopants, such as phosphorus and arsenic. For p-type in-situ doping, p-type doping precursors, such as diborane ($B_2H_6$), boron trifluoride ($BF_3$), and any other p-type doping precursor, can be used. For n-type in-situ doping, n-type doping precursors, such as phosphine ($PH_3$), arsine ($AsH_3$), and any other n-type doping precursor, can be used. Semiconductor layers 122 can have respective vertical dimensions 122t (e.g., thicknesses) along a z-axis, each ranging from about 6 nm to about 10 nm (e.g., about 7 nm, about 8 nm, or about 9.5 nm). Other dimensions and materials for semiconductor layers 122 are within the scope and spirit of this disclosure. Though four layers of semiconductor layers 122 are shown in FIG. 1B, semiconductor device 100 can have any number of semiconductor layers 122.

Source/drain regions 110 can be grown on regions of base fin portion 108A that do not underlie gate structures 112. In some embodiments, source/drain regions 110 can be source/drain (S/D) regions of finFETs 102A-102D. In some embodiments, source/drain regions 110 can have any geometric shape, for example, polygonal or circular. Source/drain regions 110 can include an epitaxially-grown semiconductor material. In some embodiments, the epitaxially grown semiconductor material is the same material as the material of substrate 106. In some embodiments, the epitaxially-grown semiconductor material includes a different material from the material of substrate 106. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. In some embodiments, source/drain regions 110 can be grown by (i) chemical vapor deposition (CVD), such as low pressure CVD (LPCVD), atomic layer CVD (AL-CVD), ultrahigh vacuum CVD (UHVCVD), reduced pressure CVD (RPCVD), and any other suitable CVD; (ii) molecular beam epitaxy (MBE) processes; (iii) any suitable epitaxial process; or (iv) a combination thereof. In some embodiments, source/drain regions 110 can be grown by an epitaxial deposition/partial etch process, which repeats the epitaxial deposition/partial etch process at least once. Such repeated deposition/partial etch process is also called a cyclic deposition-etch (CDE) process. In some embodiments, source/drain regions 110 can be formed using one or more amorphous materials. In some embodiments, source/drain regions 110 can have a back surface 110A and a front surface 110B that are opposite to each other.

Source/drain regions 110 can be n-type for NFETs and p-type for PFETs. In some embodiments, source/drain regions 110 of finFETs 102A, 102B, 102C, and 102D can be the same or opposite doping type with respect to each other. P-type source/drain regions 110 can include SiGe and can be in-situ doped during an epitaxial growth process using p-type dopants, such as boron, indium, and gallium. For p-type in-situ doping, p-type doping precursors, such as diborane ($B_2H_6$), boron trifluoride ($BF_3$), and any other p-type doping precursor, can be used. In some embodiments, n-type source/drain regions 110 can include Silicon and may be in-situ doped during an epitaxial growth process using n-type dopants, such as phosphorus and arsenic. For n-type in-situ doping, n-type doping precursors, such as phosphine ($PH_3$), arsine ($AsH_3$), and any other n-type doping precursor, can be used.

Referring to FIG. 1B, source/drain regions 110 can form source/drain (S/D) regions of finFETs 102A-102D. Each of the channel regions in semiconductor layers 122 of fin top portions 108B can be interposed between a pair of S/D regions. Though finFETs 102A-102D are shown to have fin structure 108 with fin top portions 108B on fin base portion 108A, other fin structures (e.g., a single layered fin structure etched from or epitaxially grown on substrate 106) of finFETs 102A through 102D are within the scope and spirit of this disclosure.

In some embodiments, fin base portion 108A and fin top portion 108B can have respective vertical dimensions $H_1$ and $H_2$ (e.g., heights) along a z-axis, each ranging from about 40 nm to about 60 nm (e.g., about 45 nm, about 50 nm, or about 55 nm). Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm (e.g., about 85 nm, about 90 nm, about 100 nm, or about 115 nm). In some embodiments, fin structure 108 can have a horizontal dimension $L_1$ (e.g., length) along an x-axis ranging from about 100 nm to about 1 μm (e.g., about 200 nm, about 300 nm, about 500 nm, about 750 nm, or about 900 nm). Other dimensions and materials for fin structure 108 are within the scope and spirit of this disclosure.

In some embodiments, finFETs 102A-102D can further include gate structures 112 and spacers 114. Referring to FIGS. 1A and 1B, gate structures 112 can be multi-layered structures and can wrap around fin top portions 108B. In some embodiments, each of semiconductor layers 122 of fin top portions 108B can be wrapped around by one of gate structures 112 or one or more layers of one of gate structures 112 for which gate structures 112 can be also referred to as "gate-all-around (GAA) structures" or "horizontal gate-all-around structures" and finFETs 102A-102D can be also referred to as "GAA FETs" or "GAA finFETs."

Each gate structure 112 can include a gate dielectric layer 112A disposed on semiconductor layers 122 and a gate electrode 112B disposed on gate dielectric layer 112A. Gate dielectric layer 112A can be wrapped around each semiconductor layer 122, and thus electrically isolate semiconductor layers 122 from each other and from conductive gate electrode 112B to prevent electric shorts between gate structures 112 and S/D regions during operation of finFETs 102A-102D. In some embodiments, gate dielectric layer 112A can include (i) a layer of silicon oxide, silicon nitride, and/or silicon oxynitride formed by CVD, atomic layer deposition (ALD), physical vapor deposition (PVD), e-beam evaporation, or any other suitable deposition process, (ii) a high-k dielectric material, such as $HfO_2$, titanium oxide ($TiO_2$), tantalum oxide ($Ta_2O_3$), $HfSiO_4$, zirconium oxide ($ZrO_2$), and zirconium silicate ($ZrSiO_2$), (iii) a high-k dielectric material having oxides of lithium (Li), beryllium (Be), magnesium (Mg), Ca, Sr, Sc, Y, Zr, Al, La, Ce, praseodymium (Pr), neodymium (Nd), samarium (Sm), europium (Eu), Gd, terbium (Tb), Dy, holmium (Ho), Er, thulium (Tm), ytterbium (Yb), lutetium (Lu), or (v) a combination thereof. High-k dielectric layers can be formed by ALD or by any other suitable deposition process.

Gate work function layer 130 can include a single work function layer or a stack of work function layers. Multi-threshold voltages can be achieved by configuring work function layers of finFETs 102A-102D such that threshold voltages can be different between devices. In some embodiments, gate work function layer 130 can include any suitable material. In some embodiments, gate work function layers can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, gate work function layer 130 can include Al-doped metal, such as Al-doped Ti, Al-doped TiN, Al-doped Ta, and Al-doped TaN. Gate work function layers 130 can be formed using a suitable process, such as ALD, CVD, PVD, plating, and combinations thereof. In some embodiments, gate work function layer 130 can have a thickness ranging from about 2 nm to about 15 nm (e.g., about 2 nm, about 3 nm, about 5 nm, about 10 nm, or about 15 nm). Other materials, formation methods and thicknesses for gate work function layers 130 are within the scope and spirit of this disclosure.

Each gate electrode 132 can include a single metal layer or a stack of metal layers. The stack of metal layers can include metals different from each other. In some embodiments, each gate electrode 132 can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and combinations thereof. Gate electrodes 132 can be formed by ALD, PVD, CVD, or any other suitable deposition process. Other materials and formation methods for gate electrodes 132 are within the scope and spirit of this disclosure. Though gate structures 112 of finFETs 102A-102D are shown to be similar, finFETs 102A-102D can have gate structures with materials and/or electrical properties (e.g., threshold voltage, work function value) different from each other. Also, though gate structures 112 are shown to have horizontal GAA structures, other gate structures (e.g., vertical GAA structures or gate structures without GAA structures) are within the scope and spirit of this disclosure.

Spacers 114 can form sidewalls of gate structures 112 and be in physical contact with portions of gate dielectric layers 112A, according to some embodiments. Spacers 114 can include insulating material, such as silicon oxide, silicon nitride, a low-k material, and a combination thereof. Spacer 114 can include a single layer or a stack of insulating layers. Spacers 114 can have a low-k material with a dielectric constant less than about 3.9 (e.g., about 3.5, about 3.0, or about 2.8). In some embodiments, spacers 114 can include a material composed of silicon, oxygen, carbon, and/or nitrogen. The concentrations of silicon, oxygen, carbon, and nitrogen in the material for spacers 114 can depend on the desired dielectric constant for spacers 114. Varying concentrations of silicon, oxygen, carbon, and nitrogen in the material can vary the desired dielectric constant of spacers 114. In some embodiments, each spacer 114 can include a layer of silicon oxycarbonitride (SiOCN), a layer of silicon carbon nitride (SiCN), a layer of silicon oxide carbide (SiOC), or a combination thereof. In some embodiments, each spacer 114 can include a stack of a SiOCN layer disposed on a SiOC layer, which is disposed on a SiOCN layer. In some embodiments, each spacer 114 can have a thickness St ranging from about 5 nm to about 12 nm (e.g., about 5 nm, about 6 nm, about 8 nm, about 10 nm, or about 12 nm). Other materials and dimensions for spacers 114 are within the scope and spirit of this disclosure.

Inner spacers 127 can be formed between source/drain regions 110 and work function layer 130. Inner spacers 127 can reduce the parasitic capacitance of finFETs 102A-102D. Each inner spacer 127 can have a low-k material with a dielectric constant less than about 3.9 (e.g., about 3.5, about 3.0, or about 2.8) or a high-k material with a dielectric constant ranging from about 4 to about 7. In some embodiments, inner spacer structures 127 can include a single layer or a stack of dielectric layers. In some embodiments, inner spacer structures 127 can include suitable dielectric material composed of silicon, oxygen, carbon, and/or nitrogen. The concentrations of silicon, oxygen, carbon, and nitrogen in the dielectric material for inner spacer structures 127 can depend on the desired dielectric constant. Varying concentrations of silicon, oxygen, carbon, and nitrogen in inner spacer structures 127 can vary its desired dielectric constant. Inner spacer structures 127 can be formed using SiOC, SiCN, SiOCN, SiN, silicon oxide ($SiO_x$), silicon oxynitride ($SiO_yN$) and/or a combination thereof, deposited by ALD, flowable CVD (FCVD), or any other suitable deposition process.

Backside contacts 140 are formed under source/drain regions 110 and can supply power to finFETs 102A-102D. For example, backside contacts 140 can be connected to a direct current (DC) power supply (e.g., $V_{DD}$) and provide power to source/drain regions 110. In some embodiments, backside contacts 140 can be used to send and/or receive electric signals between source/drain region 110 and external contacts (not shown in FIGS. 1A and 1B.) Backside contact 140 can include low-temperature liner layer 141 and conductive contact 142. In some embodiments, low-temperature liner layer 141 can be formed between conductive contacts 142 and substrate 106. In some embodiments, salicide region 144 can be formed in source/drain region 110 and in contact with conductive contacts 142.

Low-temperature liner layer 141 can protect inner spacers 127 and stack of semiconductor layers 122. This protection can be provided during various fabrication processes against physical damages or chemical reactions. For example, spacers and semiconductor layers can be protected during a cleaning process performed on exposed source/drain region 110 and prior to forming conductive contacts 142. Cleaning processes, such as a pre-salicide cleaning, can use any suitable cleaning solutions, such as a fluoride-based cleaning solution. Without low-temperature liner layer 141, solutions used in the cleaning process can etch away portions of inner spacers 127 and substrate 106 resulting in circuit shorts or current leakage. In some embodiments, low-temperature liner layer 141 low-temperature liner layer 141 can be formed using atomic layer deposition (ALD), plasma-enhanced ALD (PEALD), low pressure chemical vapor deposition (LPCVD), plasma enhanced chemical vapor deposition (PECVD), chemical vapor deposition (CVD), any suitable deposition methods, and/or combinations thereof. In some embodiments, low-temperature liner layer 141 can be formed using silicon nitride, silicon carbon oxide, silicon carbon nitride, silicon boron carbon nitride, hafnium oxide, aluminum oxide, any suitable material, and/or combinations thereof. In some embodiments, low-temperature liner layer 141 can have a thickness ranging from about 0.5 nm to about 30 nm. For example, low-temperature liner layer 141 can have a thickness between about 0.5 nm and about 5 nm, between about 5 nm and about 10 nm, between about 10 nm and about 30 nm. Other materials, formation methods, and thicknesses for low-temperature liner layer 141 are within the scope and spirit of this disclosure.

Conductive contacts 142 can be formed by any suitable conductive material. For example, conductive contacts 142 can be formed using metal or metal alloys, such as ruthenium, cobalt, tungsten, copper, silver, aluminum, titanium, tantalum, titanium nitride, nickel, platinum, tantalum nitride, any suitable metal or metal alloy, and combinations thereof. In some embodiments, conductive contacts 142 can be formed using a non-metal conductive material, such as a doped semiconductor material. Conductive material 142 can be formed by one or more deposition processes, such as CVD, PVD, PECVD, any suitable deposition process, and combinations thereof.

Salicide region 144 (not shown in FIG. 1A but shown in FIG. 1B) can be formed between conductive contacts 142 and source/drain region 110. Salicide region 144 can reduce contact resistance between conductive contacts 142 and source/drain region 110 and inhibit electromigration. In some embodiments, salicide region 144 can be formed of a metal-silicon compound. The metal material of the metal-silicon compound can be formed of, titanium, cobalt, nickel, nickel cobalt alloy, platinum, nickel platinum alloy, iridium, iridium platinum alloy, erbium, ytterbium, palladium, rhodium, niobium, titanium silicon nitride, any suitable metal material, and/or combinations thereof.

ILD layer 118 can be disposed on source/drain regions 110 and between gate structures 112. ILD layer 118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. Other materials and formation methods for ILD layer 118 are within the scope and spirit of this disclosure.

STI regions 138 (shown in FIG. 1A but not in FIG. 1B) can provide electrical isolation between finFETs 102A-102D with fin structure 108 and neighboring finFETs on substrate 106 and/or neighboring active and passive elements (not shown) integrated with or deposited on substrate 106. In some embodiments, STI regions 138 can include first and second protective liners 138A-138B and an insulating layer 138C disposed on second protective liner 138B. First and second protective liners 138A-138B can include materials different from each other. Each of first and second protective liners 138A-138B can include an oxide or nitride material. In some embodiments, first protective liner 138A can include a nitride material. Second protective liner 138B can include an oxide material and can prevent oxidation of the sidewalls of fin top portion 108B during the formation of insulating layer 138C. In some embodiments, insulating layer 138C can include silicon oxide, silicon nitride, silicon oxynitride, fluorine-doped silicate glass (FSG), a low-k dielectric material, and/or any other suitable insulating material. In some embodiments, first and second protective liners 138A-138B each can have a thickness ranging from about 1 nm to about 2 nm. In some embodiments, STI regions 138 can have a vertical dimension 138H (e.g., height) along a z-axis ranging from about 40 nm to about 60 nm (e.g., about 45 nm, about 50 nm, or about 55 nm). In some embodiments, vertical dimension 138H can be half of the total height $H_T$ of fin structure 108.

The cross-sectional shapes of semiconductor device 100 and its elements (e.g., substrate 106, fin structure 108, gate structures 112, source/drain regions 110, spacers 114, inner spacers 127, and/or STI regions 138) are illustrative and are not intended to be limiting. For example, the bulk of substrate 106 can be thinned down from back surface 107 after finFETs 102A-102D are formed. A dielectric layer can be deposited on the thinned down back surface and backside contacts 140 can be formed in the dielectric layer. In some embodiments, MEOL and BEOL structures (e.g., source/drain contacts, gate contacts, active and passive semiconductor devices, etc.) can be formed on ILD layer 118 and gate structures 112.

Figure 2:
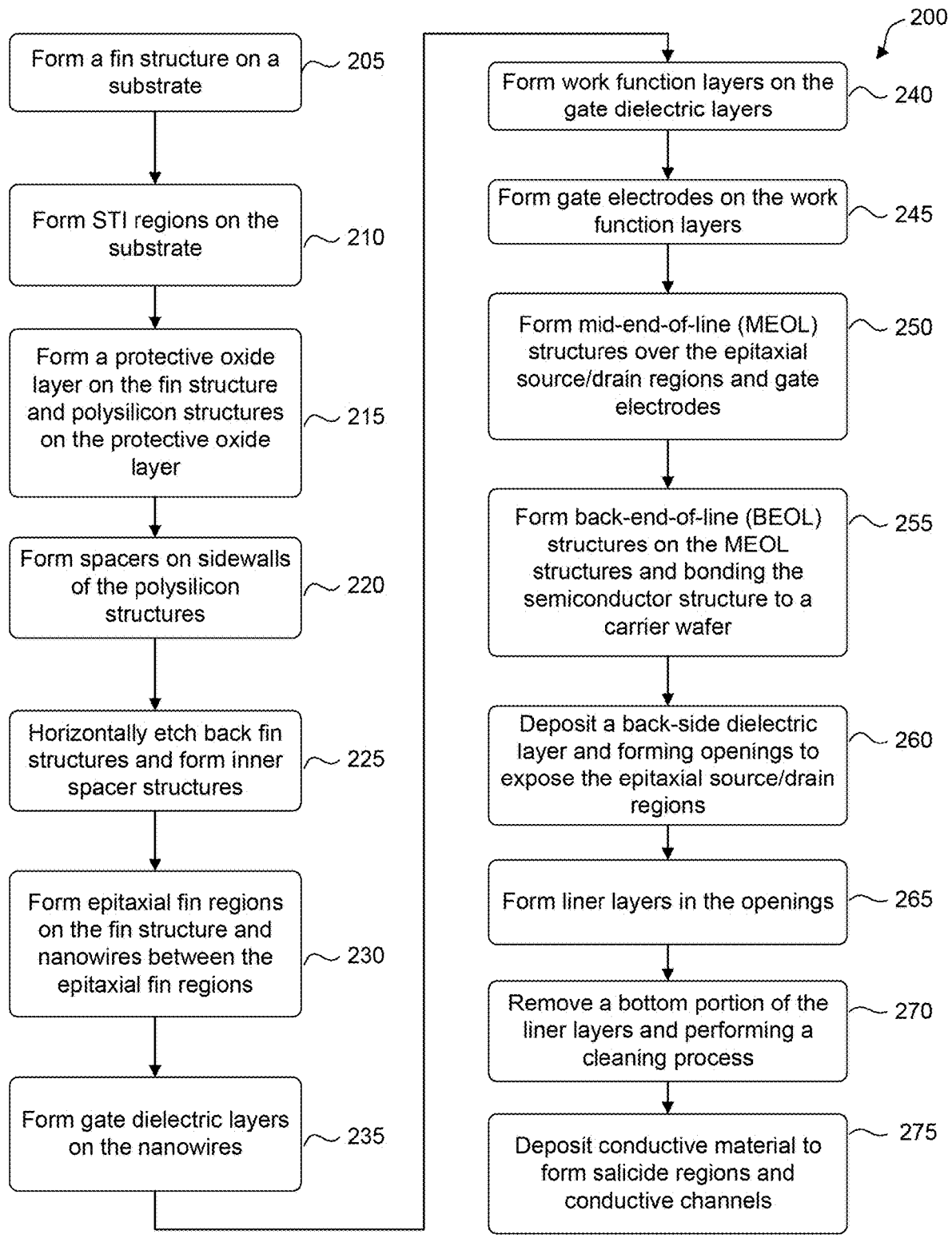
FIG. 2 is a flow diagram of a method for fabricating a low-temperature liner layer in semiconductor devices, in accordance with some embodiments.

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-20. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Similar elements in FIGS. 3A-20 and FIGS. 1A and 1B are labelled with the same annotations for simplicity.

Referring to FIG. 2, in operation 205, a fin structure is formed on a substrate, according to some embodiments. For example, fin structure 108 with fin base portion 108A and fin top portion 108B can be formed on substrate 106 as described with reference to FIGS. 3A-3C. FIG. 3B is a cross-sectional view of the structure in FIG. 3A as viewed from the B-B line. FIG. 3C is a cross-sectional view of the structure in FIG. 3A as viewed from the C-C line. The formation of fin structure 108 can include the formation of fin base portion 108A and fin top portion 108B* on substrate 106 as shown in FIGS. 3A-3C. Subsequent processing of fin top portion 108B*, described below, can form fin top portion 108B as described with reference to FIGS. 1A and 1B.

Fin top portion 108B* can include first and second semiconductor layers 320 and 122 stacked in an alternating configuration. Each of first and second semiconductor layers 320 and 122 can be epitaxially grown on its underlying layer and can include semiconductor materials different from each other. In some embodiments, first and second semiconductor layers 320 and 122 can include semiconductor materials similar to or different from substrate 106. In some embodiments, first and second semiconductor layers 320 and 122 can include semiconductor materials with oxidation rates and/or etch selectivity different from each other. In some embodiments, each of first and second semiconductor layers 320 and 122 can include silicon germanium (SiGe) with germanium content in a range from about 25 atomic percent to about 50 atomic percent (e.g., about 30 atomic percent, about 35 atomic percent, or about 45 atomic percent) with any remaining atomic percent being silicon or can include silicon without any substantial amount of germanium.

First and/or second semiconductor layers 320 and 122 can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane ($B_2H_6$), boron trifluoride ($BF_3$), and any other p-type doping precursor, can be used. For n-type in-situ doping, n-type doping precursors, such as phosphine ($PH_3$), arsine ($AsH_3$), and any other n-type doping precursor, can be used. First and second semiconductor layers 320 and 122 can have respective vertical dimensions 320t and 122t (e.g., thicknesses) along a z-axis, each ranging from about 6 nm to about 10 nm (e.g., about 7 nm, about 8 nm, or about 9.5 nm). Vertical dimensions 320t and 122t can be equal to or different from each other. Though four layers of semiconductor layers 320 and 122 are shown in FIGS. 3A-3C, semiconductor device 100 can have any number of semiconductor layers 320 and 122.

Forming fin base portion 108A and fin top portion 108B* can include forming a stack of materials for first and second semiconductor layers 320 and 122 on substrate 106 and etching a portion of substrate 106 and the stack of materials through patterned hard mask layers 340 and 342 formed on the stack of materials. In some embodiments, hard mask layer 340 can be a thin film including silicon oxide formed using, for example, a thermal oxidation process. In some embodiments, hard mask layer 342 can be formed of silicon nitride using, for example, LPCVD or PECVD. The etching of the stack of materials can include a dry etch, a wet etch process, or a combination thereof. The dry etch process can include using etchants having an oxygen-containing gas, a fluorine-containing gas, a chlorine-containing gas, a bromine-containing gas, an iodine-containing gas, any other suitable etching gas and/or plasma, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

In some embodiments, fin base portion 108A and fin top portion 108B* can have respective vertical dimensions $H_1$ and $H_2$ (e.g., heights) along a z-axis, each ranging from about 40 nm to about 60 nm (e.g., about 45 nm, about 50 nm, or about 55 nm). Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm (e.g., about 85 nm, about 90 nm, about 100 nm, or about 115 nm). In some embodiments, fin structure 108 can have a horizontal dimension $L_1$ (e.g., length) along an x-axis ranging from about 100 nm to about 1 μm (e.g., about 200 nm, about 300 nm, about 500 nm, about 750 nm, or about 900 nm). In some embodiments, fin structure 108 can have a tapered cross-section along a yz-plane with a horizontal dimension $W_1$ (e.g., width) of fin base portion 108B along a y-axis being greater than a horizontal dimension $W_2$ of fin top portion 108B along the y-axis. Horizontal dimension $W_1$ and $W_2$ can range from about 6 nm to about 20 nm (e.g., about 6 nm, about 8 nm, about 10 nm, about 15 nm, about 17 nm, or about 20 nm).

Figure 4A:
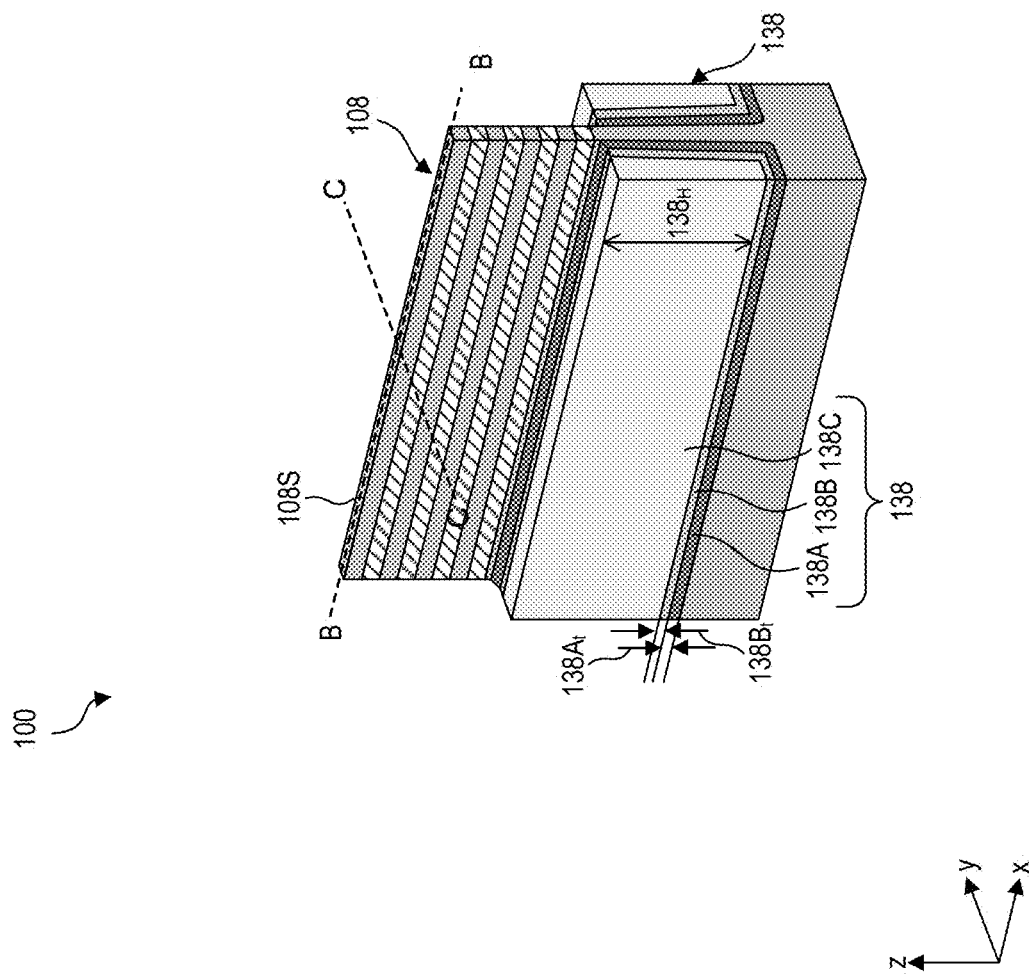

Referring to FIG. 2, in operation 210, STI regions are formed on the substrate, according to some embodiments. Referring to FIGS. 4A-4C, STI regions 138 with first and second protective liners 138A-138B and insulating layer 138C can be formed on substrate 106. Forming STI regions 138 can include (i) depositing a layer of nitride material (not shown) for first protective liners 138A on the structure of FIG. 3A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 4A. The layers of nitride and oxide materials can be deposited using a suitable process for depositing oxide and nitride materials, such as ALD and CVD. These layers of oxide and nitride materials can prevent oxidation of the sidewalls of fin top portion 108B* during the deposition and annealing of the insulating material for insulating layer 138C. In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane ($SiH_4$) and oxygen ($O_2$) as reacting precursors. In some embodiments, the layer of insulating material can be formed using a sub-atmospheric CVD (SACVD) process or high aspect-ratio process (HARP), where process gases can include tetraethoxysilane (TEOS) and/or ozone ($O_3$).

Figure 5A:
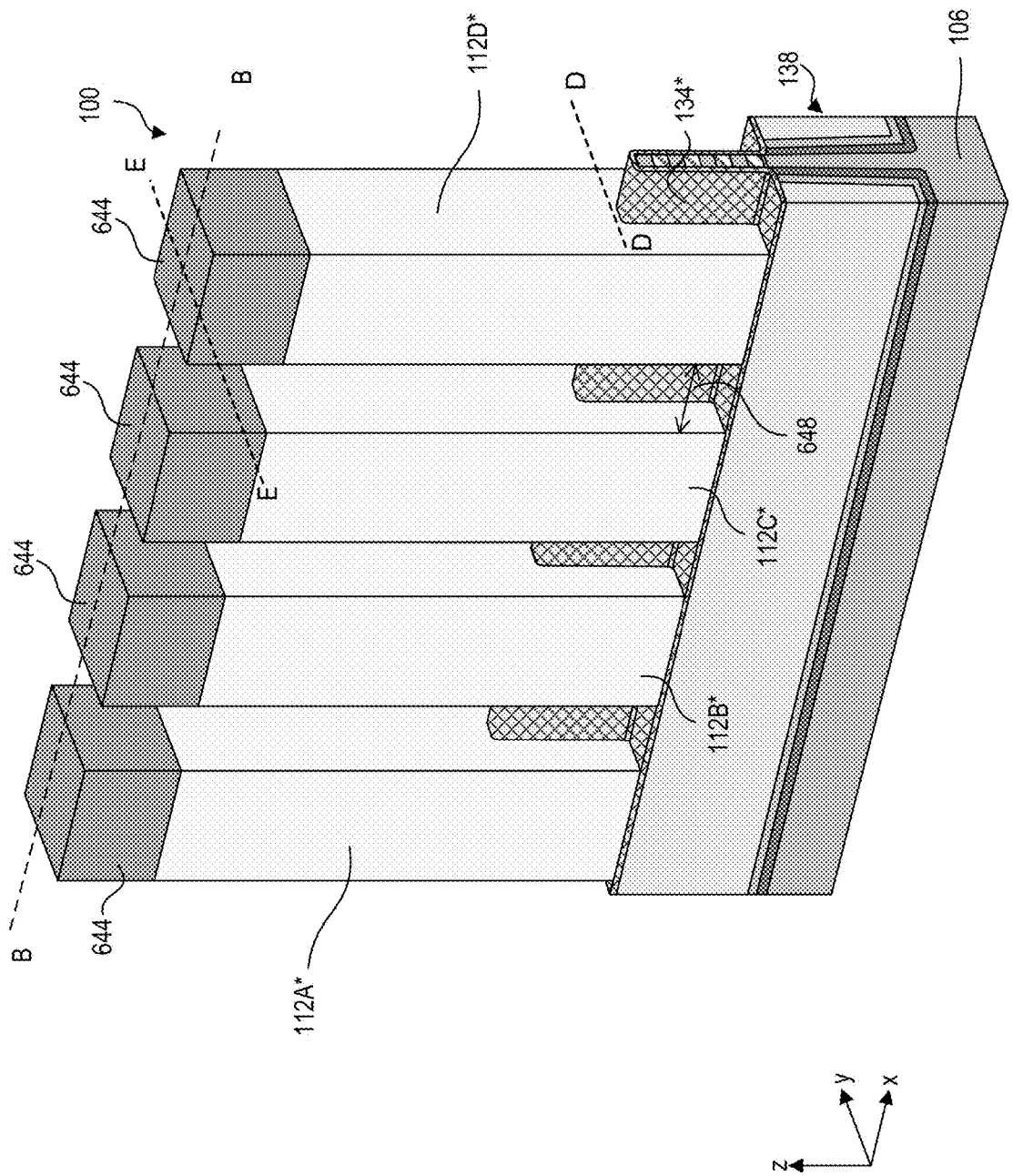
Figure 5B:
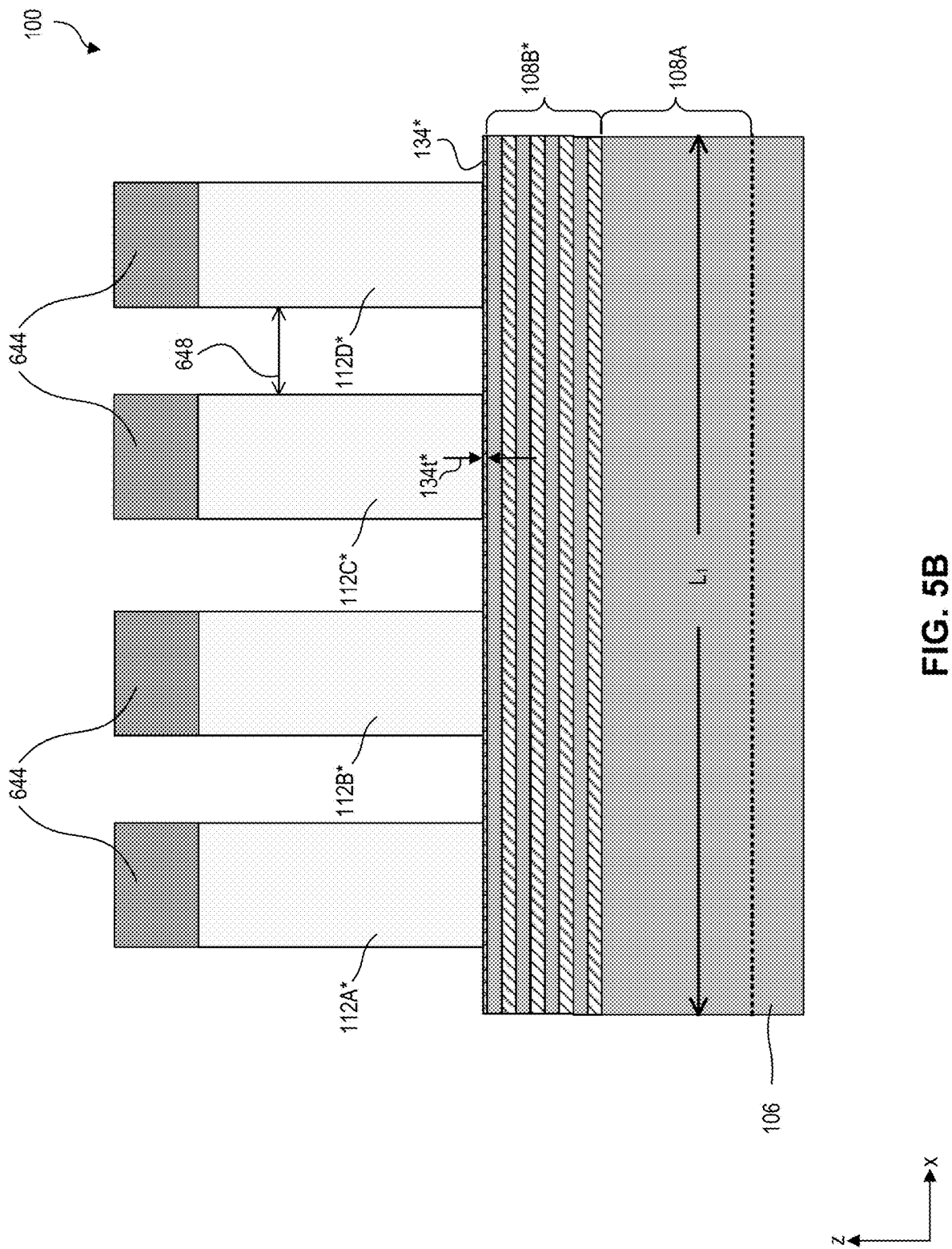
Figure 5D:
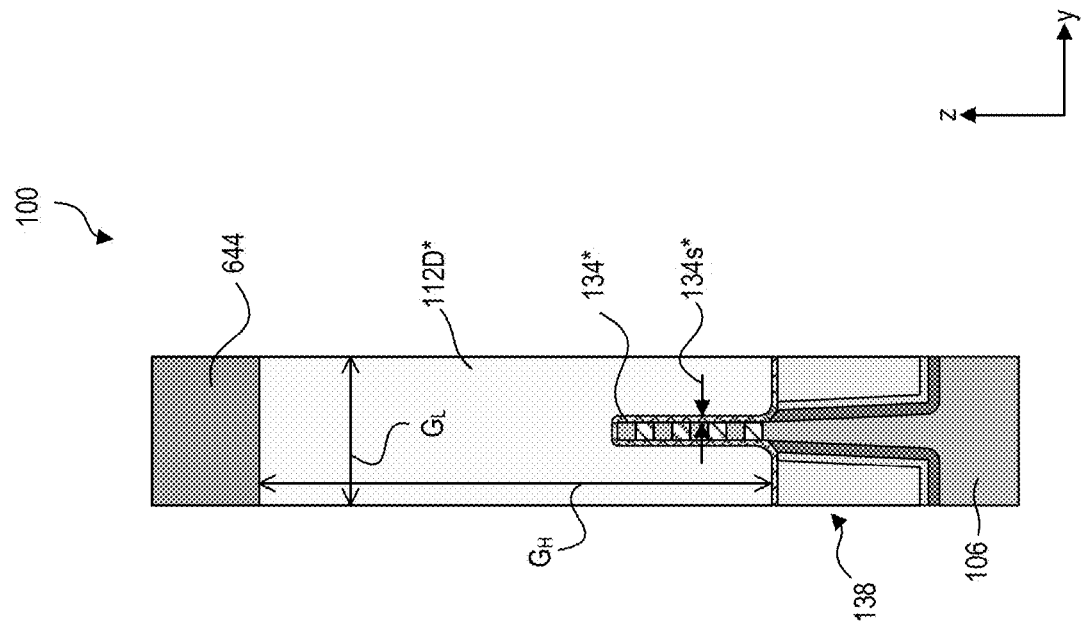
Figure 5C:
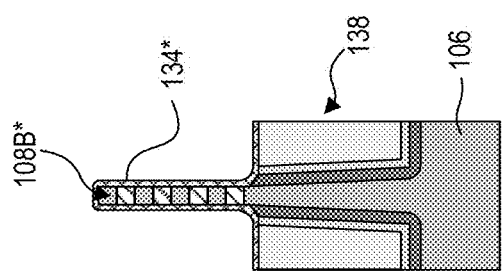

Referring to FIG. 2, in operation 215, a protective oxide layer is formed on the fin structure and polysilicon structures are formed on the protective oxide layer, according to some embodiments. For example, as shown in FIGS. 5A-5D, a protective oxide layer 134* can be formed on fin structure 108 and STI regions 138 and polysilicon structures 112A*-112D* can be formed on protective oxide layer 134*. FIGS. 5B, 5C, and 5D are cross-sectional views of the structure in FIG. 5A as viewed from the B-B, D-D, and E-E line. The formation of protective oxide layer 134* can include blanket depositing a layer of oxide material on the structure of FIG. 4A followed by a high temperature anneal process. Protective oxide layer 134* can include a suitable oxide material, such as silicon oxide, and can be blanket deposited using a suitable deposition process, such as CVD, ALD, plasma enhanced ALD (PEALD), physical vapor deposition (PVD), and e-beam evaporation. The deposition of the layer of oxide material can be followed by a dry anneal process under oxygen gas flow.

In some embodiments, protective oxide layer 134* can have a vertical dimension 134t* (e.g., thickness on top surface of fin structure 108) along a z-axis and a horizontal dimension 134s* (e.g., thickness on sidewalls of fin top portion 108B) along a y-axis, each ranging from about 1 nm to about 3 nm (e.g., about 1 nm, or 2 nm). In some embodiments, dimension 134t* can be equal to or greater than dimension 134s*. Other oxide materials, formation methods, and thicknesses for protective oxide layer 134* are within the scope and spirit of this disclosure. The presence of protective oxide layer 134* allow etching polysilicon from high aspect ratio spaces 646 (e.g., aspect ratio greater than 1:15, 1:18, or 1:20) shown in FIG. 5A between adjacent polysilicon structures 112A*-112D* without substantially etching and/or damaging fin structure 108 during the formation of polysilicon structures 112A*-112D*.

In some embodiments, protective oxide layer 134* can be removed during a subsequent gate replacement process when finFETs 102A-102D are used as non-input/output (non-I/O) devices in core circuits (can be also referred to as "logic circuits" or "memory circuits") formed in core regions (can be also referred to as "logic regions" or "memory regions") of an integrated circuit (IC). In some embodiments, the non-I/O devices can be core devices, logic devices, and/or memory devices that are not configured to handle the input/output voltages/currents directly. In some embodiments, the non-I/O devices includes logic gates, such as NAND, NOR, INVERTER, and a combination thereof. In some embodiments, the non-I/O devices include a memory device, such as a static random-access memory (SRAM) device. In some embodiments, protective oxide layer 134* may not be removed and can form a part of gate dielectric layers of gate structures 112 when finFETs 102A-102B are used as an I/O device in peripheral circuits (e.g., IO circuits) formed in peripheral regions (can be also referred to as "I/O regions" or "high voltage regions") of an IC. The I/O devices can be configured to handle the input/output voltages/currents of the IC and to tolerate a greater amount of voltage or current swing than the non-I/O devices.

The formation of protective oxide layer 134* can be followed by the formation of polysilicon structures 112A*-112D* as shown in FIGS. 5A-5D. During subsequent processing, polysilicon structures 112A*-112D* can be replaced in a gate replacement process to form gate structures 112 of finFETs 102A-102D, respectively, as shown in FIG. 1A. In some embodiments, the formation of polysilicon structures 112A*-112D* can include blanket depositing a layer of polysilicon material on the deposited protective oxide layer 134* and etching the layer of polysilicon material through a patterned hard mask layer 644 (shown in FIGS. 5A-5D) formed on the layer of polysilicon material. In some embodiments, polysilicon material can be undoped and hard mask layer 644 can include an oxide layer and/or a nitride layer. The oxide layer can be formed using a thermal oxidation process and the nitride layer can be formed by LPCVD or PECVD. Hard mask layer 644 can protect polysilicon structures 112A*-112D* from subsequent processing steps (e.g., during formation of spacers 114, source/drain regions 110, and/or ILD layer 118). The blanket deposition of the layer of polysilicon material can include CVD, PVD, ALD, or any other suitable deposition process. In some embodiments, etching of the deposited layer of polysilicon material can include a dry etch, a wet etching, or a combination thereof.

In some embodiments, vertical dimensions $G_H$ of polysilicon structures 112A*-112D* along a z-axis can be in a range from about 100 nm to about 150 nm (e.g., about 100 nm, about 120 nm, about 135 nm, or 150 nm). In some embodiments, horizontal dimensions GL of polysilicon structures 112A*-112D* along an x-axis can be in a range from about 3 nm to about 30 nm (e.g., about 3 nm, about 5 nm, about 7 nm, about 10 nm, about 12 nm, about 15 nm, about 20 nm, or about 30 nm). Polysilicon structures 112A*-112D* can have a high aspect ratio equal to or greater than about 9 (e.g., about 10, about 12, about 15, about 18, or about 20), where aspect ratio is a ratio of dimension $G_H$ to dimension $G_L$. In some embodiments, horizontal dimensions 648 along an x-axis (e.g., spacing) between adjacent polysilicon structures 112A*-112D* can be in a range from about 40 nm to about 90 nm (e.g., about 40 nm, about 50 nm, about 60 nm, about 80 nm, or about 90 nm). In some embodiments, horizontal dimensions 648 can be different between adjacent polysilicon structures. The sum of a value of dimension 648 and a value of dimension $G_L$ is referred to as "one contacted poly pitch (1CPP)." In some embodiments, horizontal dimension $L_1$ of fin structure along an x-axis can be at least 3CPP to prevent the relaxation of strain in fin structure 108, and consequently prevent the relaxation of strain in channel regions formed in fin top portions of second semiconductor layers 122 under gate structures 112 as discussed above.

Figure 6A:
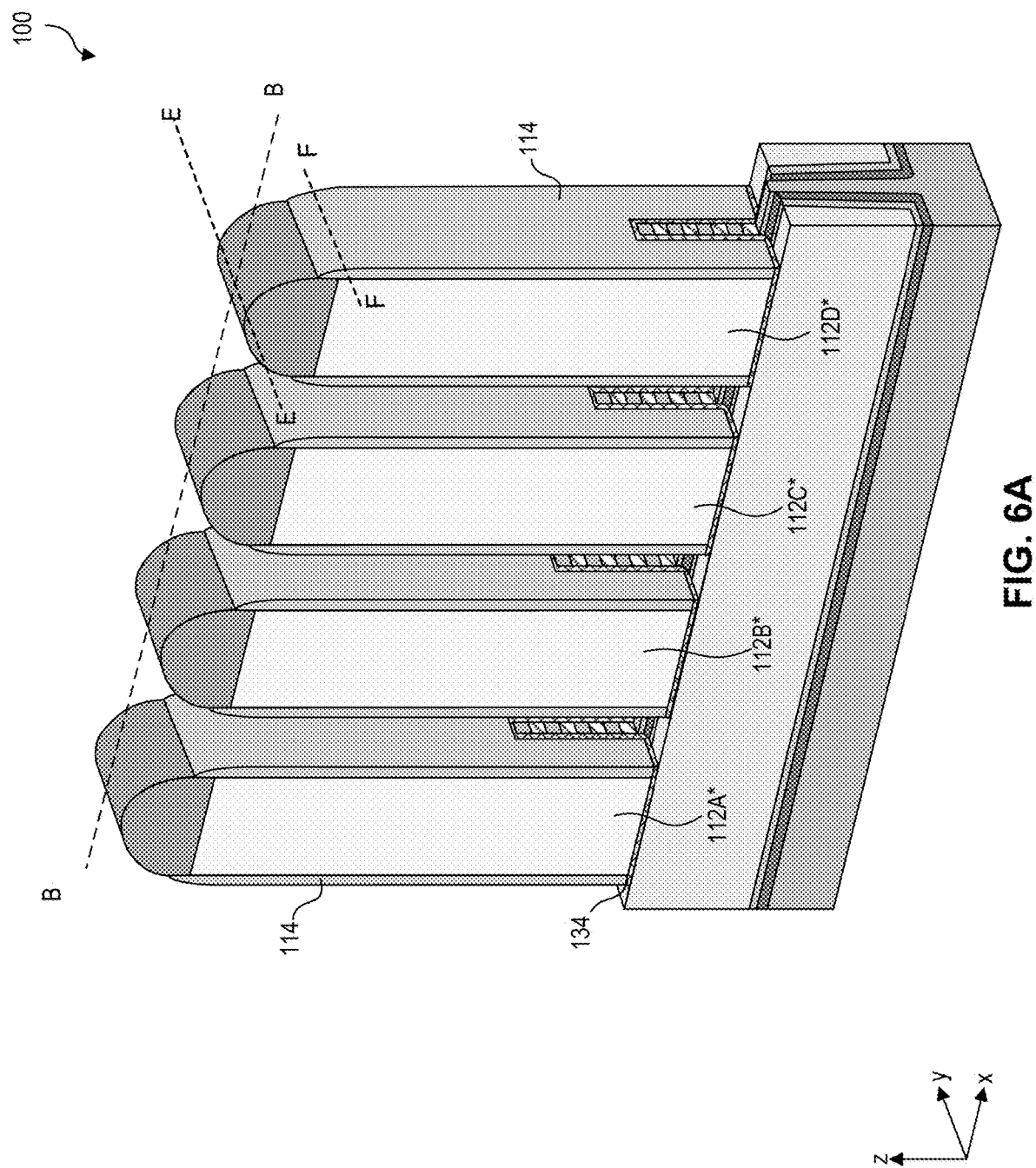

Referring to FIG. 2, in operation 220, spacers are formed on sidewalls of the polysilicon structures and fin top portions are etched, according to some embodiments. Referring to FIGS. 6A-6D, spacers 114 can be formed on sidewalls of polysilicon structures 112A*-112D*. FIG. 6C-6D are cross-sectional views of the structure in FIG. 6A as viewed from the B-B, E-E, and F-F lines. Forming spacers 114 can include blanket depositing a layer of an insulating material (e.g., an oxide, a nitride, and/or silicon carbon oxynitride material) on the structure of FIG. 5A by a CVD, a PVD, or an ALD process followed by photolithography and an etching process (e.g., reactive ion etching or any other suitable dry etching process using a chlorine or fluorine based etchant). Spacers 114 can each have a horizontal dimension St (e.g., thickness) along an x-axis ranging from about 5 nm to about 12 nm, according to some embodiments. Forming of spacers 114 can be followed by forming oxide layer 134 (shown in FIGS. 6A-6D) underlying polysilicon structures 112A*-112D* by etching protective oxide layer 134* from regions not covered by polysilicon structures 112A*-112D* and spacers 114. The etch process can include a wet etch process using, for example, diluted HF. A vertical etch of portions of fin top portion 108B* can be performed after forming oxide layer 134. The vertical etch includes etching fin top portion 108B* that are not underlying spacers 114 and polysilicon structures 112A*-112D*. During the etching process, polysilicon structures 112A*-112D* can be protected from being etched by hard mask layer 644 and spacers 114.

Figure 7A:
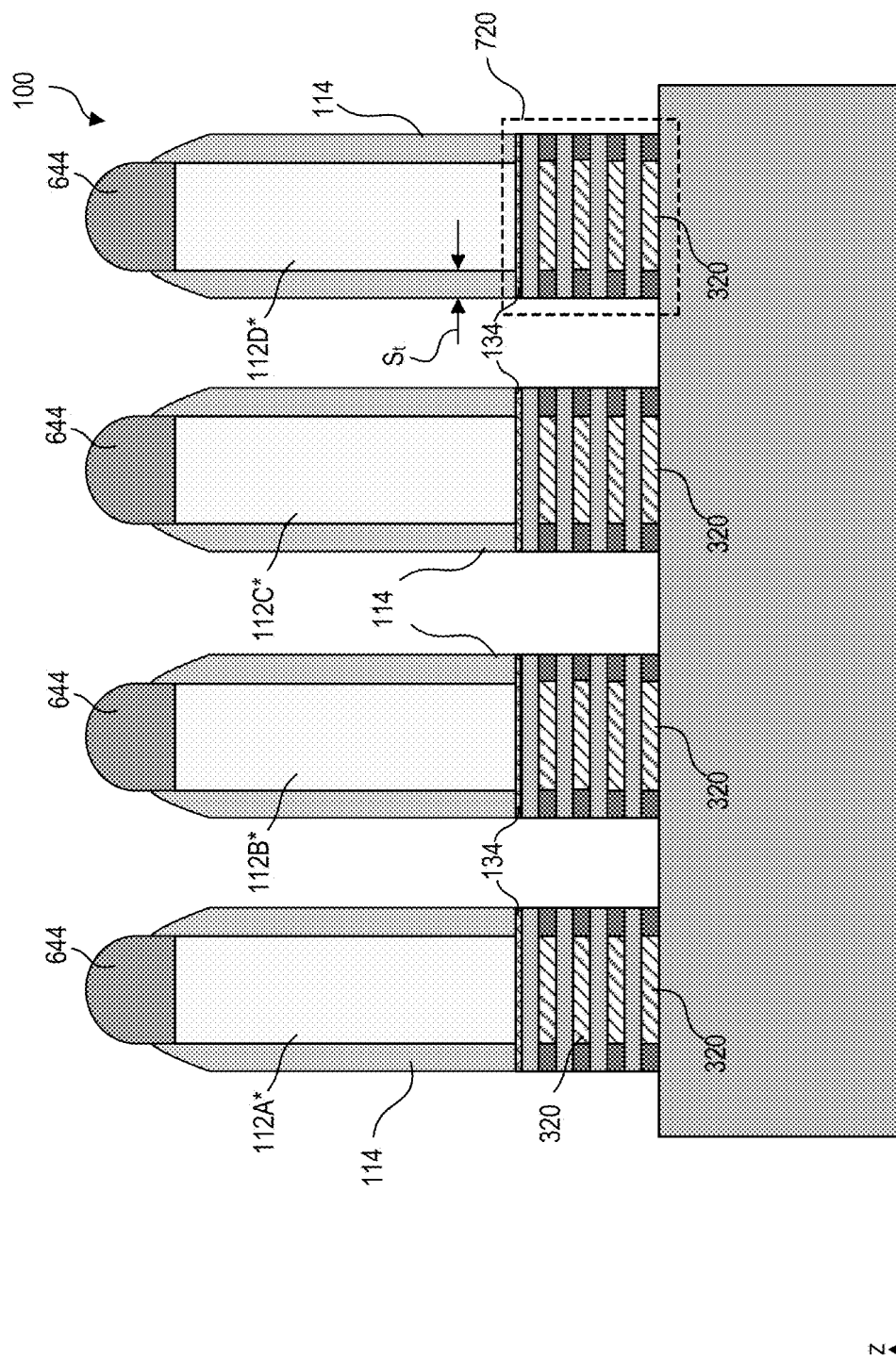
Figure 7C:
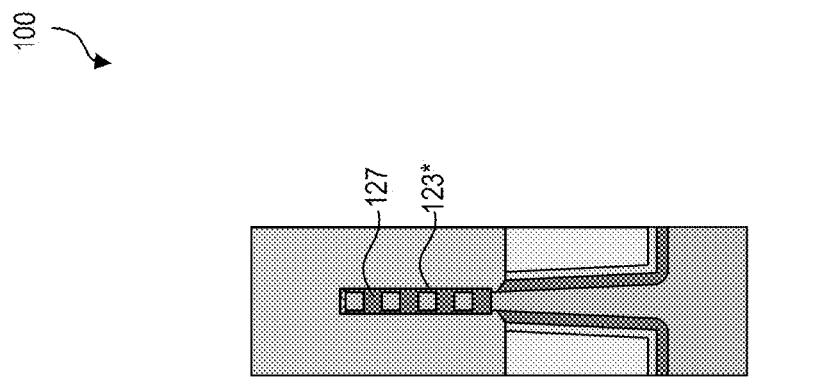
Figure 7B:
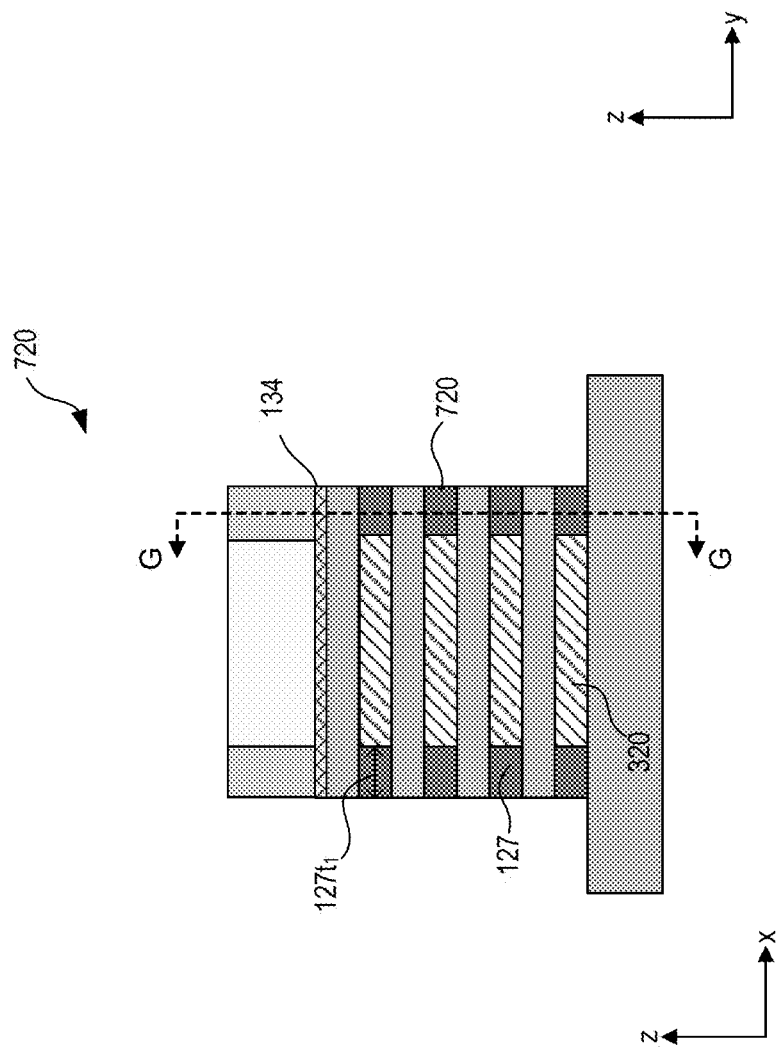

Referring to FIG. 2, in operation 225, a horizontal etch process is performed and inner spacer structures are formed in the fin structure, according to some embodiments. Referring to FIGS. 7A-7C, the vertical etch of the portions of fin top portions 108B* can be followed by a horizontal etch of portions of first semiconductor layers 320 below polysilicon structures 112A*-112D* and spacers 114 to form recessed regions. FIG. 7B is an enlarged view of region 720 shown in FIG. 7A. FIG. 7C is a cross-sectional view of the structure illustrated in FIG. 7B as viewed from the lines of G-G. The horizontal etch can be performed by a dry etching process, a wet etching process, or a combination thereof. The etching process can include a plurality of cycles of etching and purging processes, such as about 3 to about 20 cycles of etching and purging processes. The etching process in each cycle can include using a gas mixture having hydrogen fluoride (HF), nitrogen trifluoride ($NF_3$), a fluorine based gas, and a chlorine based gas.

The process of forming recess regions can be followed by a blanket deposition of a dielectric material layer and a horizontal etch of the blanket deposited dielectric material layer to form inner spacers 127 within the recessed regions. In some embodiments, the blanket deposition process can include a plurality of cycles of deposition and etch processes. In each cycle, the etch process can follow the deposition process to prevent the formation of voids within inner spacers 127 by removing seams that can be formed during deposition of dielectric material layer within the recessed regions. Inner spacer structures 127 can include a single layer or a stack of dielectric layers, deposited by ALD, FCVD, or any other suitable deposition process. The etch process in each cycle of the blanket deposition process of dielectric material layer can include a dry etch process using a gas mixture of HF and $NH_3$. Inner spacer structures 127 can include suitable dielectric material composed of silicon, oxygen, carbon, and/or nitrogen. Carbon concentration can be low in the dielectric material and can range from about 1% to about 15% (e.g., about 1.5%, about 2.5%, about 5%, about 10%, or about 13%). Carbon concentration in the dielectric material outside this range can lead to longer etch time and reduced etch selectivity.

The horizontal etch process of the blanket deposited dielectric material layer to form inner spacers 127 can be performed by a dry etch process using a gas mixture of HF and $NH_3$. The gas ratio of HF to $NH_3$ can range from about 1 to about 20 (e.g., about 1, about 5, about 10, about 15, or about 20). In some embodiments, inner spacer structures 127 can have a dimension $127t_1$ (e.g., thickness) along an x-axis ranging from about 3 nm to about 12 nm (e.g., about 3 nm, about 5 nm, about 8 nm, or about 10 nm). Other methods of deposition and horizontal etch processes for forming inner spacer structures 127 and other suitable dimensions of inner spacer structures 127 are within the scope and spirit of this disclosure.

Figure 8A:
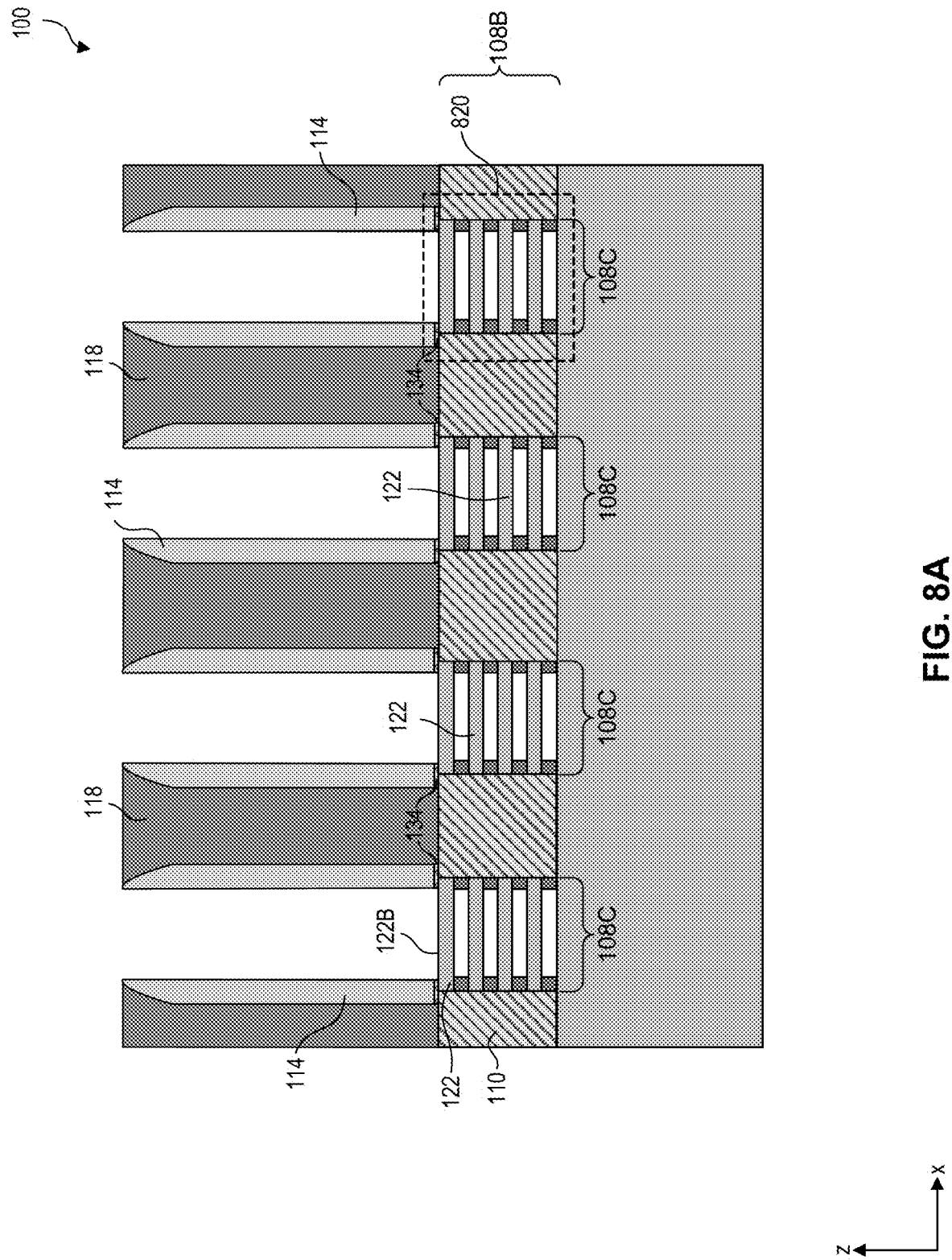
Figure 8B:
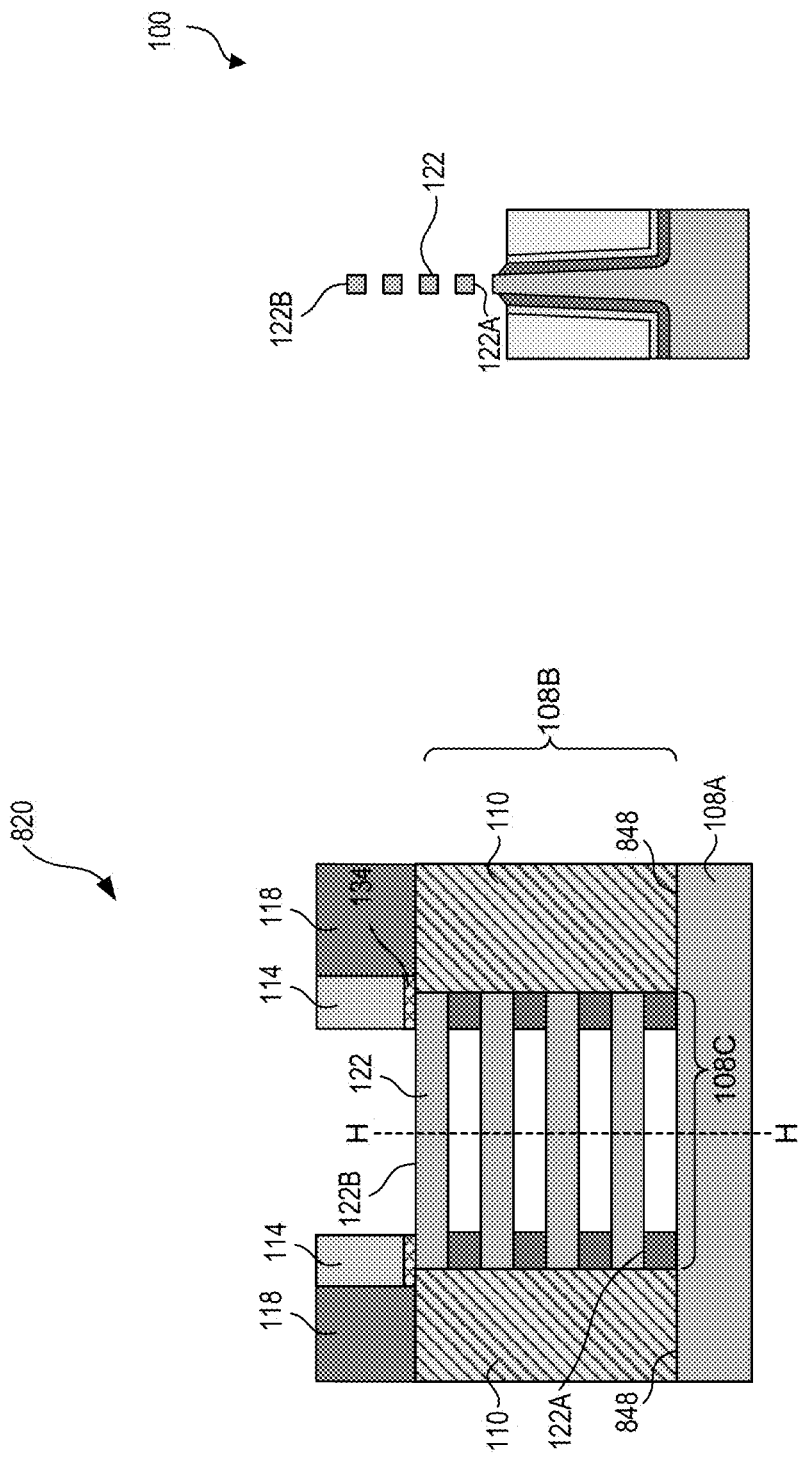
Figure 8C:

Referring to FIG. 2, in operation 230, epitaxial fin regions are formed on the fin structure and nanowires are formed between the epitaxial fin regions. Referring to FIGS. 8A-8C, source/drain regions 110 can be grown on exposed surfaces of fin base portion 108A and on exposed surfaces of second semiconductor layers 122 of the structure of FIG. 7A. FIG. 8B is an enlarged view of region 820 illustrated in FIG. 8A. FIG. 8C is a cross-sectional view of the structure in FIG. 8B along the line H-H.

In some embodiments, a portion of source/drain regions 110 can be under spacers 114 and/or extend into fin base portion 108A. In some embodiments, source/drain regions 110 can be grown by (i) CVD, such as low pressure CVD (LPCVD), atomic layer CVD (ALCVD), ultrahigh vacuum CVD (UHVCVD), reduced pressure CVD (RPCVD), and any suitable CVD; (ii) molecular beam epitaxy (MBE) processes; (iii) any suitable epitaxial process; or (iv) a combination thereof. In some embodiments, source/drain regions 110 can be grown by an epitaxial deposition/partial etch process, which repeats the epitaxial deposition/partial etch process at least once. In some embodiments, source/drain regions 110 can be grown by selective epitaxial growth (SEG), where an etching gas is added to promote the selective growth of semiconductor material on the exposed surfaces of second semiconductor layers 122 and fin base portion 108A, but not on insulating materials.

In some embodiments, source/drain regions 110 can be p-type or n-type. In some embodiments, p-type source/drain regions 110 can include silicon germanium and can be in-situ doped during the epitaxial growth process using p-type dopants, such as boron, indium, and gallium. For p-type in-situ doping, p-type doping precursors, such as diborane ($B_2H_6$), boron trifluoride ($BF_3$), and any other p-type doping precursor, can be used. In some embodiments, n-type source/drain regions 110 can include silicon without any substantial amount of germanium and can be in-situ doped during the epitaxial growth process using n-type dopants, such as phosphorus and arsenic. For n-type in-situ doping, n-type doping precursors, such as phosphine ($PH_3$), arsine ($AsH_3$), and any other n-type doping precursor, can be used.

Each source/drain region 110 can form S/D regions for finFETs 102A-102D. Second semiconductor layers 122 underlying polysilicon structures 112A*-112D* and interposed between adjacent S/D regions can form the channel regions of finFETs 102A-102D. In subsequent processing, gate-all-around (GAA) structures can be formed to wrap around each of the channel regions by replacing first semiconductor layers 320 (shown in FIGS. 7A-7B) of fin top portions 108B underlying polysilicon structures 112A*-112D* with one or more layers of gate structures 112.

In some embodiments, fin base portion 108A underlying the etched portions of fin top portion 108B between spacers 114 can be recessed during the vertical etch process described in operation 225. Interfaces 848 between source/drain regions 110 and fin base portion 108A can be on the same plane as top surfaces of STI regions 138 or can be below the top surface planes of STI regions 138. Other dimensions and structures for source/drain regions 110 are within the scope and spirit of this disclosure. The process of forming epitaxial regions 110 can be followed by removing first semiconductor layers 320 of fin top portions 108B to form nanowire shaped second semiconductor layers 122, as shown in FIGS. 8A-8C. Semiconductor layers 122 can be formed in channel regions 108C that are in contact with source/drain regions 110. In some embodiments, channel regions 108C can have a back surface 122A, which is the bottom surface of the bottom-most semiconductor layer 122. Channel region 108C can have a front surface 122B which is the top surface of the top-most semiconductor layer 122 that is towards the top of fin top portion 108B.

Removing first semiconductor layers 320 can be followed by forming an etch stop layer (ESL) (not shown) on spacers 114 and on source/drain regions 110. The formation of ILD layer 118 on the ESL can use a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using a FCVD process. The deposition process can be followed by a thermal annealing of the deposited layer of dielectric material in steam at a temperature ranging from about 200° C. to about 700° C. for a period ranging from about 30 minutes to about 120 minutes.

The formation of ILD layer 118 can be followed by removing polysilicon structures 112A*-112D* using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or potassium hydroxide (KOH) wet etch can be used to remove polysilicon structures 112A*-112D*, or a dry etch followed by a wet etch process can be used to remove polysilicon structures 112A*-112D*. The exposed portions of oxide layer 134 can be removed using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof. In some embodiments, oxide layer 134 may not be removed.

Figure 9A:
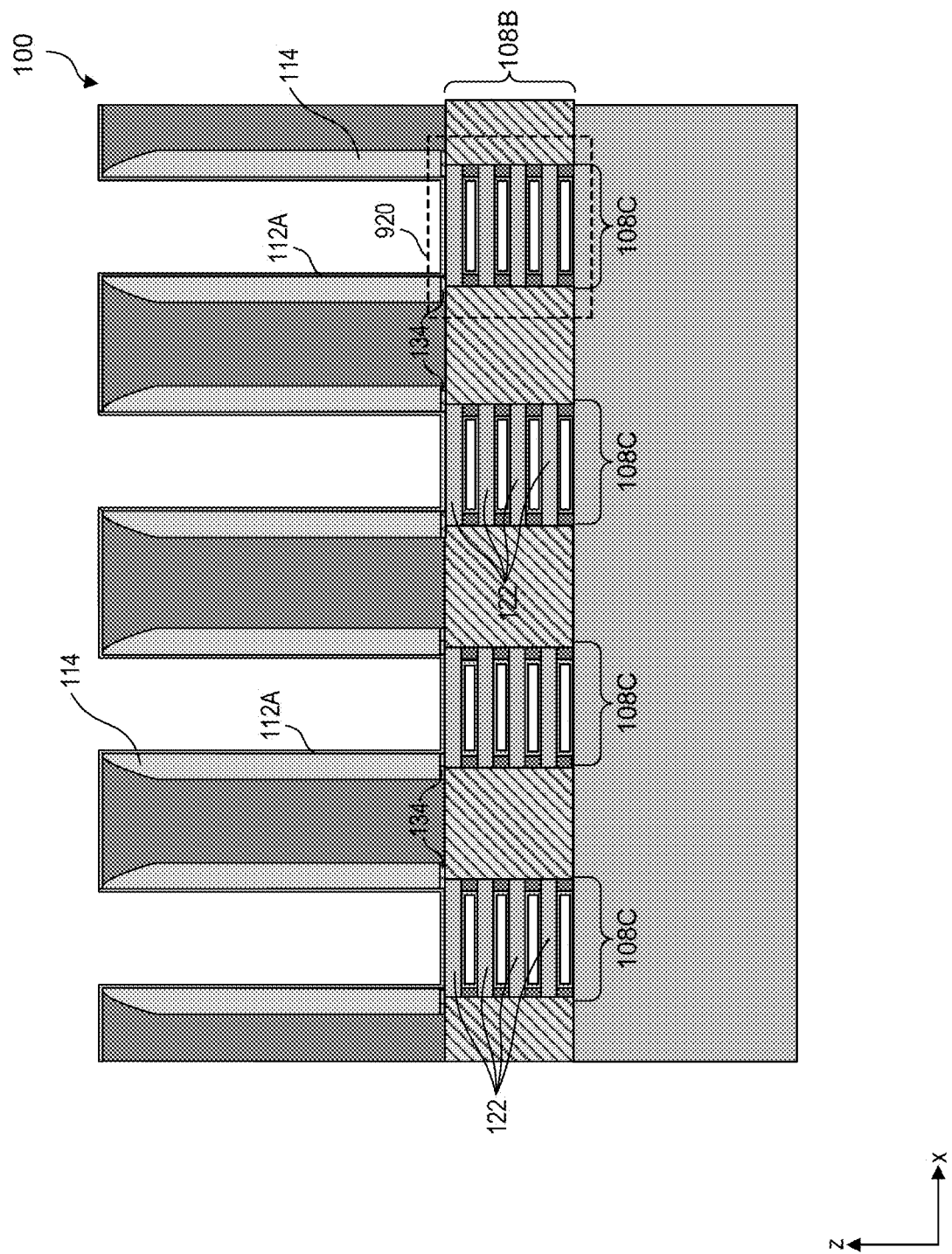

Referring to FIG. 2, in operation 235, gate dielectric layers are formed on the nanowires. Referring to FIGS. 9A-9C, gate dielectric layers 112A can be wrapped around on exposed nanowire shaped second semiconductor layers 122 of fin top portions 108B. FIG. 9B is an enlarged view of region 920 in FIG. 9A. FIG. 9C is a cross-sectional view of the structure in FIG. 9B as viewed from the I-I line. Forming gate dielectric layers 112A can include a blanket deposition process of a suitable gate dielectric material layer. The gate dielectric material layer for gate dielectric 112A can be blanket deposited on the structure of FIG. 8A. Gate dielectric layer 112A can be formed with a thickness 112$t$ ranging from about 1.5 nm to about 2 nm (e.g., about 1.5 nm, about 1.7 nm, about 1.8 nm, or about 2 nm). The gate dielectric material of gate dielectric layer 112A are described above with reference to FIGS. 1A and 1B and are not described here in detail for simplicity. In some embodiments, an interlayer dielectric (not shown in FIGS. 9A-9C) is disposed prior to the deposition of gate dielectric layers 112A. In some embodiments, the interlayer dielectric can have a thickness of about 10 Å. In some embodiments, the thickness of the interlayer dielectric can be between about 8 Å and about 12 Å. In some embodiments, thickness of gate dielectric layer 112A can be between about 10 Å and about 20 Å (e.g., between about 10 Å and about 15 Å or between about 15 Å and about 20 Å). For example, thickness of gate dielectric layer 112A can be about 15 Å. Other deposition methods and dimensions of gate dielectric layers 112A are within the scope and spirit of this disclosure.

Figure 10:
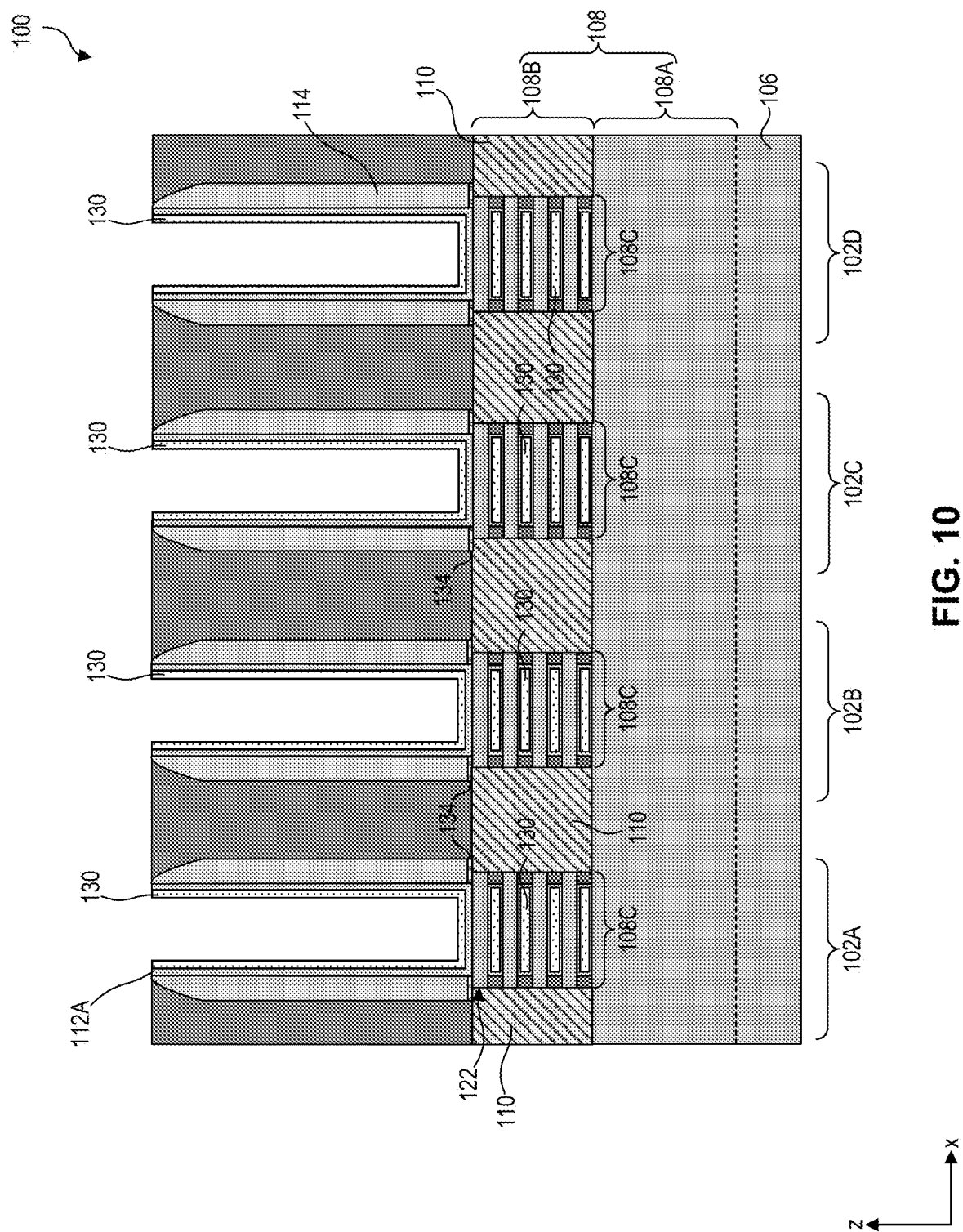
FIGS. 10-18 illustrate various cross-sectional views of semiconductor devices with a low-temperature liner layer at various stages of their fabrication process, in accordance with some embodiments.

Referring to FIG. 2, in operation 240, work function layers are formed on gate dielectric layers, according to some embodiments. Referring to FIG. 10, work function layers 130 are formed as components of finFETs 102A-102D. Each work function layer 130 can include one or more work function metal layers and can provide multi-threshold voltages across finFETs 102A-102D such that devices can have different threshold voltages. In some embodiments, each work function layer 130 for finFETs 102A-102D can be formed using the same or different material and/or thickness. In some embodiments, finFETs 102A and 102B are NFETs and finFETs 102C and 102D are PFETs. In some embodiments, finFETs 102A and 102D are low threshold voltage devices and finFETs 102B and 102C are high threshold voltage devices. Work function layers 130 can be formed on gate dielectric layer 112A that is between spacers 114 and between each layer of the stack of semiconductor layers 122. Gate dielectric layers 112A and gate work function layers 130 can each wrap around nanowire shaped semiconductor layers 122 formed as a result of the removal of first semiconductor layers 320. Depending on the spaces between adjacent semiconductor layers 122, semiconductor layers 122 can be wrapped around by gate dielectric layer 112A and work function layers 130, filling the spaces between adjacent semiconductor layers 122.

Figures 11A, 11B:
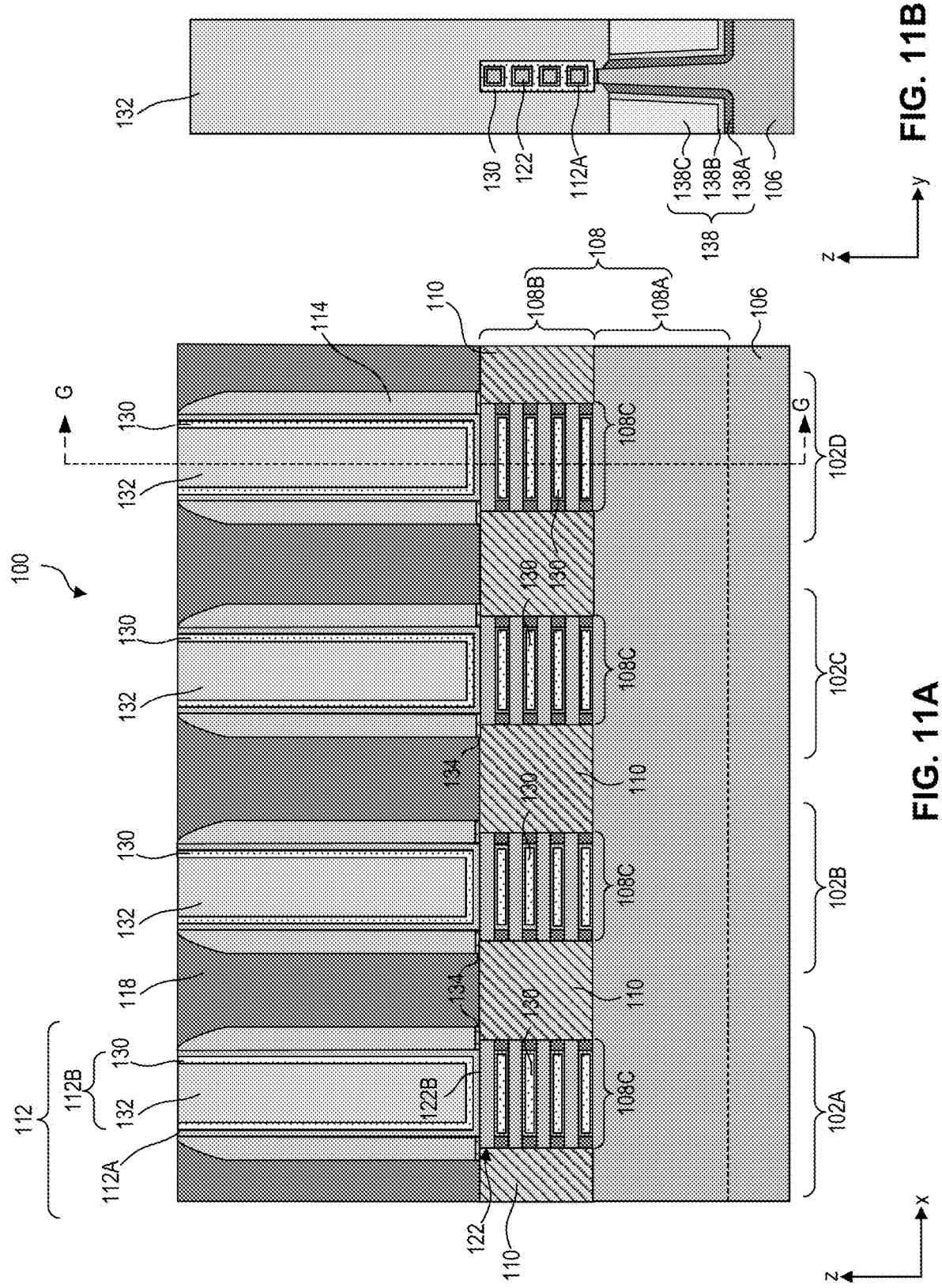

Referring to FIG. 2, in operation 245, gate electrodes are formed on the work function layers, according to some embodiments. Referring to FIGS. 11A and 11B, layers of conductive material for gate electrodes 132 are formed on work function layers 130. FIG. 12B is a cross-sectional view of the structure in FIG. 11A from the H-H line. The layer of conductive material for gate electrodes 132 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and combinations thereof. Gate electrodes 132 can be formed by ALD, PVD, CVD, or any other suitable deposition process. The deposition of gate electrodes 132 can continue until openings between opposing spacers are filled with gate electrodes 132. A chemical mechanical polishing process can remove excessive gate electrodes 132 such that top surfaces of gate electrodes 132 and ILD layer 118 are substantially coplanar. In some embodiments, other structures can be formed, such as blocking layers. One or more blocking layers (not shown in FIGS. 11A and 11B) can be formed prior to depositing gate electrodes 132 to prevent diffusion and oxidation of gate electrodes 132.

Figure 12:
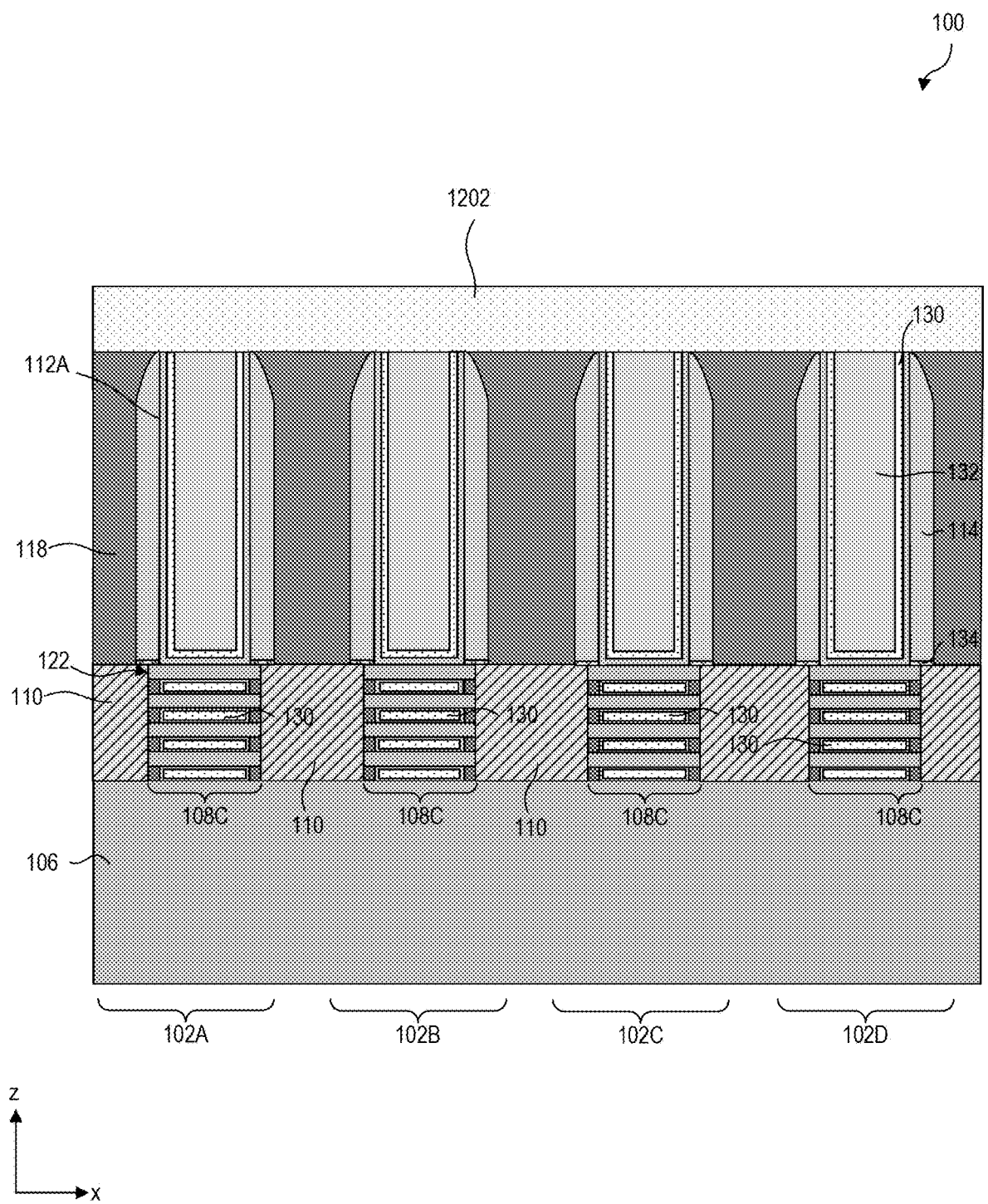

A dielectric layer can be deposited on gate electrodes and ILD layer 118, after gate electrodes are deposited, according to some embodiments. As shown in FIG. 12, a dielectric layer 1202 can be deposited onto top surfaces of gate electrode and ILD layer 118. In some embodiments, dielectric layer 1202 can be an ILD layer in which MEOL structures can be formed. Dielectric layer 1202 can be deposited on top surfaces of ILD layer 118 and gate electrodes 132. Dielectric layer 1202 can be an ILD layer that is formed using material that is similar to that of ILD layer 118. In some embodiments, dielectric layer 1202 can be formed using silicon oxide.

Figure 13:
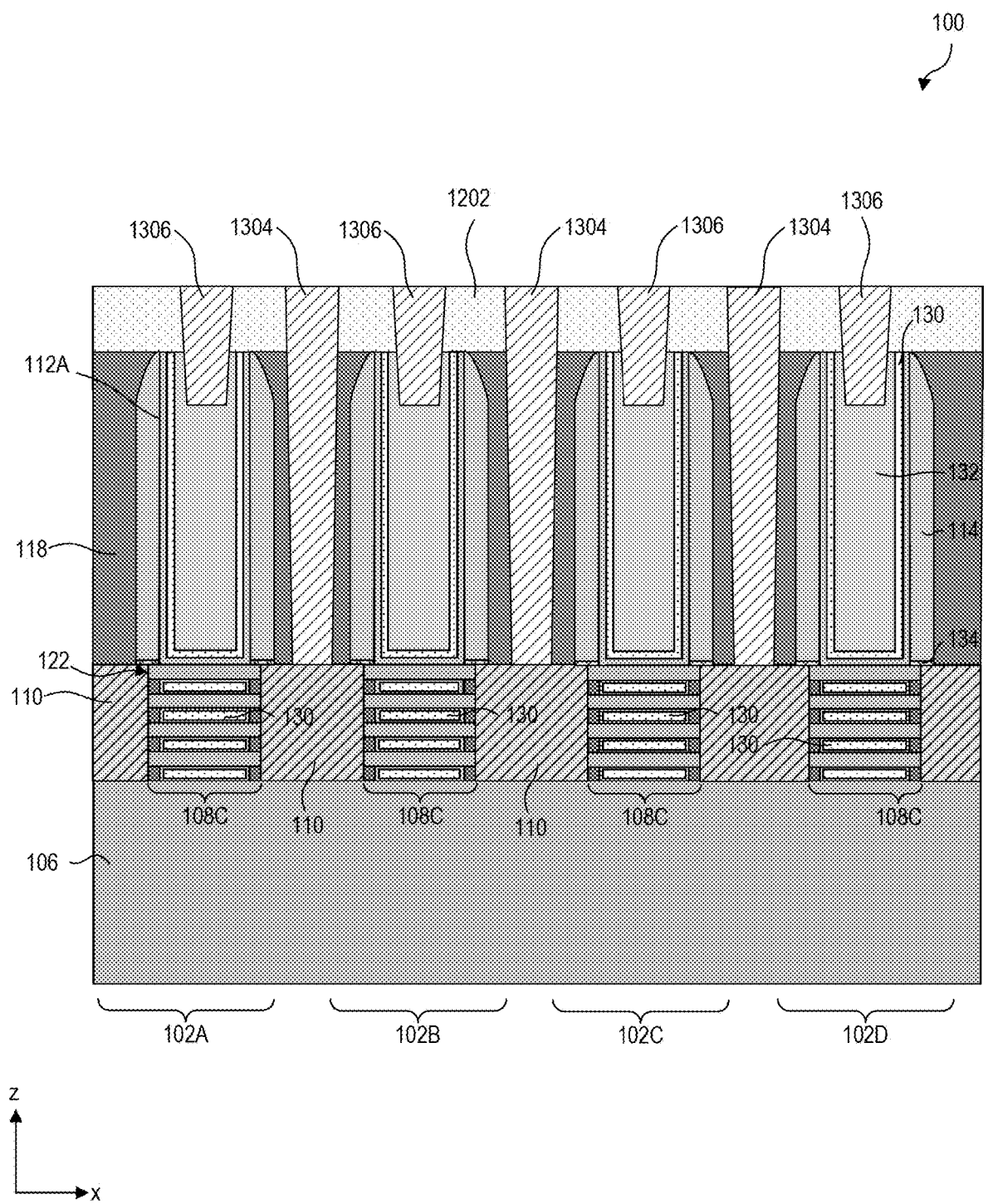

Referring to FIG. 2, in operation 250, MEOL structures are formed over the epitaxial source/drain regions and gate electrodes, according to some embodiments. Referring to FIG. 13, MEOL structures, such as source/drain contacts 1304 and gate contacts 1306, can be formed in dielectric layer 1202. In some embodiments, source/drain contacts and gate contacts 1306 can be used to respectively transmit electrical signals between source/drain regions 110 and gate electrodes 132 and external terminals (not shown in FIG. 13). Gate contacts 1306 and source/drain contacts 1304 can be formed by forming openings in gate electrodes 132 and ILD layer 118 and depositing a conductive material in the openings. The deposition process can include depositing a metal layer within the openings and performing an anneal process to induce silicidation of the deposited metal layer. The conductive materials for forming source/drain contacts 1304 and gate contacts 1306 can include titanium, aluminum, silver, tungsten, cobalt, copper, ruthenium, zirconium, nickel, titanium nitride, tungsten nitride, metal alloys, and/or combinations thereof. The deposition process can include ALD, PVD, CVD, any suitable deposition processes, and/or combinations thereof. Gate contacts 1306 and source/drain contacts 1304 can be connected to gate electrodes 132 and source/drain region 110, respectively. A planarization process can planarize the top surfaces of dielectric layer 1202, source/drain contacts 1304, and gate contacts 1306 such that the top surfaces are substantially coplanar. In some embodiments, source/drain contacts 1304 and gate contacts 1306 can extend into source/drain regions 110 and gate electrodes 132, respectively. Salicide regions can be formed between source/drain contacts 1304 and source/drain regions 110 and are not illustrated for simplicity.

Figure 14:
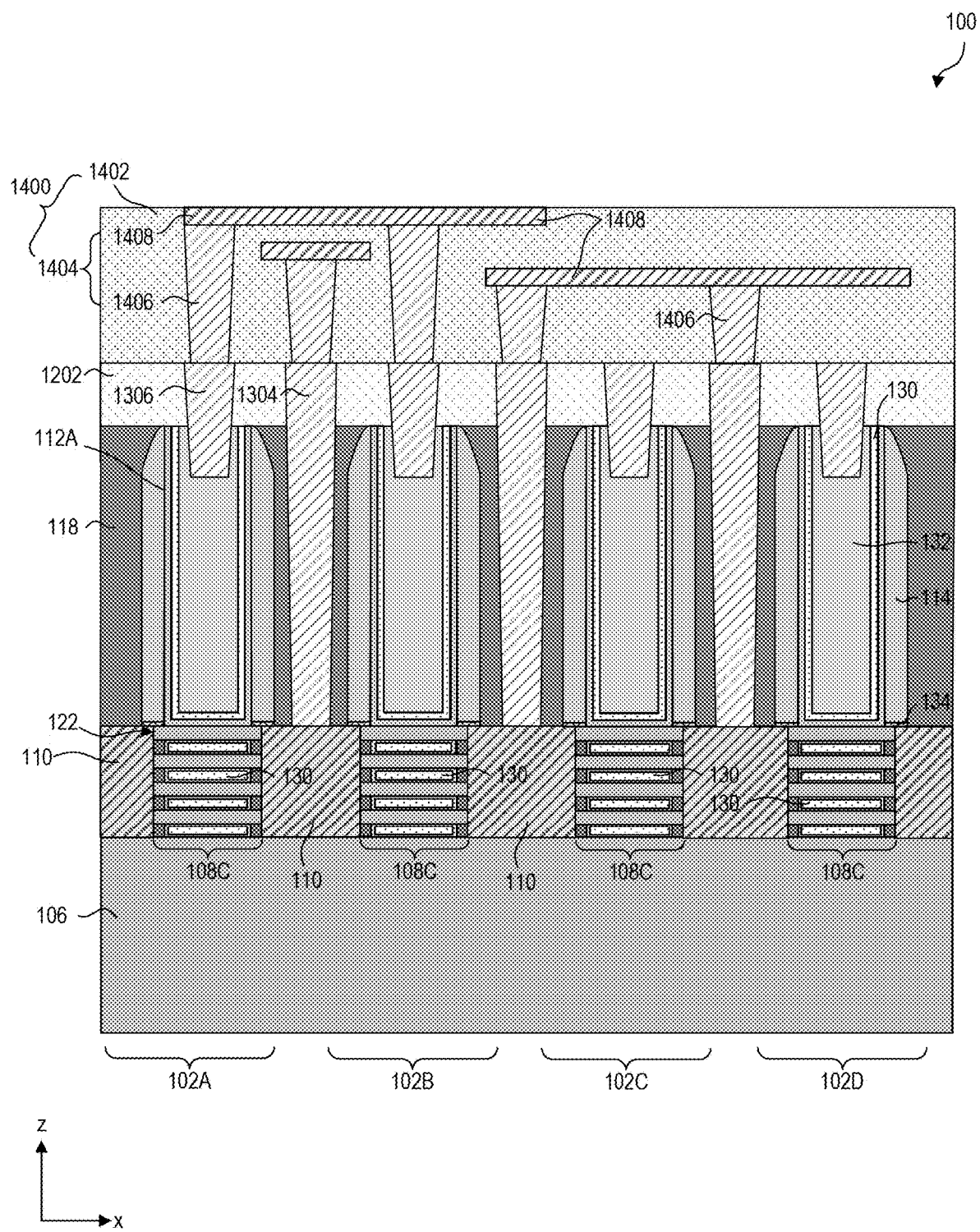

Referring to FIG. 2, in operation 255, BEOL structures are formed over the source/drain contacts and gate contacts, according to some embodiments. Referring to FIG. 14, BEOL structures 1400 can include one or more dielectric layers 1402 be deposited on dielectric layer 1202 and interconnects 1404 formed in dielectric layer 1402. In some embodiments, interconnects 1404 can be a network of electrical connections that include vias 1406 extending vertically (e.g., z direction) and wires 1408 extending laterally (e.g., in the x or y direction). Interconnects 1404 can provide electrical connections to source/drain contacts 1304 and gate contacts 1306. In some embodiments, suitable passive and active semiconductor devices can be formed in dielectric layer 1402 and are not illustrated for simplicity.

Figure 15:
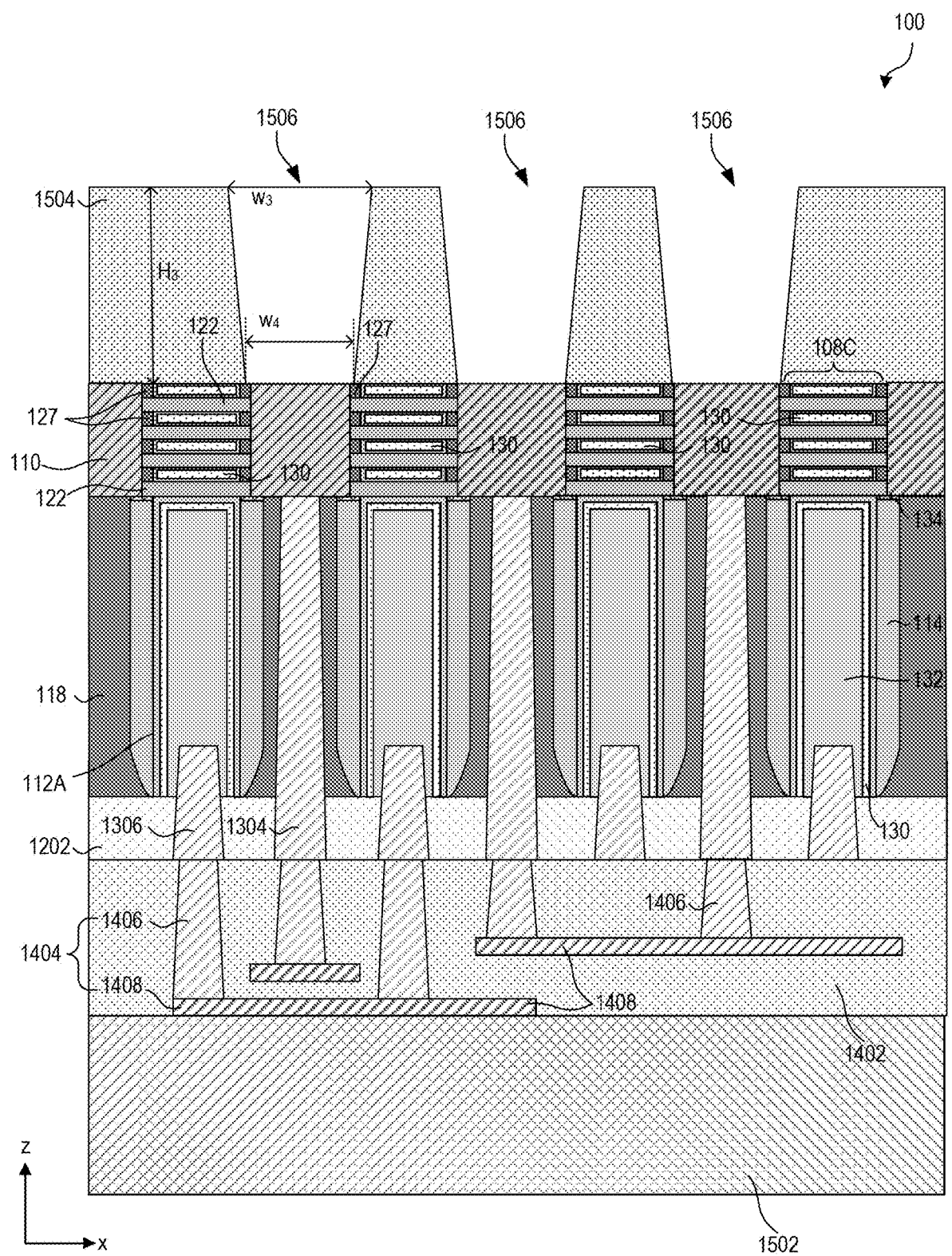

Referring to FIG. 2, in operation 260, a backside dielectric layer is deposited and openings are formed to expose the epitaxial source/drain regions, according to some embodiments. In some embodiments, semiconductor structure 100 illustrated in FIG. 14 can be attached to a carrier wafer and flipped over such that fabrication processes can proceed at the backside of semiconductor structure 100. For example, carrier wafer 1502 can be attached to BEOL structures 1400 via suitable methods, such as room temperature bonding, anodic bonding, adhesive bonding, any suitable attaching methods, and combinations of the same. Referring to FIG. 15, substrate 106 can be thinned down and backside interlayer dielectric (ILD) layer 1504 can be deposited on source/drain regions 110 and fin top portions 108B. Other layers, devices, or structures can be formed in contact with backside ILD layer 1504 and are not illustrated for simplicity. In some embodiments, backside ILD layer 1504 is optional and openings can be formed in substrate 106. In some embodiments, substrate 106 is thinned down without exposing source/drain regions 110 and fin top portions 108B, and backside ILD layer 1504 is deposited on the thinned-down substrate 106. Openings 1506 can be formed through backside ILD layer 1504 to expose source/drain regions 110. A cleaning process can be used to remove residue and prepare exposed surfaces in opening 1506 for subsequent processing, such as metal deposition. The cleaning process can remove native oxide material or oxides formed on source/drain region 110 during the etching process that formed openings 1506. However, the cleaning process can also react with backside ILD layer 1504 such that the width of the opening may be enlarged to expose inner spacers 127, and the cleaning process may reach etch inner spacers 127. Conductive material subsequently deposited into opening 1506 can be electrically connected to semiconductor layers 122 through damaged inner spacers 127. In some embodiments, openings 1506 can have a high aspect ratio (e.g., greater than about 10). In some embodiments, openings 1506 has a width $w_3$ at the top and $w_4$ at the bottom. In some embodiments, width $w_1$ can be greater than width $w_2$. For example, a ratio of widths $w_3$ over $w_4$ can be between about 1.1 and about 1.5. In some embodiments, widths $w_3$ and $w_4$ can be substantially equal. In some embodiments, openings 1506 can have a height $H_3$ that is equal to or greater than about 10 times widths $w_3$ or $w_4$. In some embodiments, widths $w_3$ and $w_4$ can be between about 10 nm and about 30 nm. For example, widths $w_3$ and $w_4$ can be between about 10 nm and about 15 nm, between about 15 nm and about 22 nm, between about 22 nm and about 30 nm, or any suitable ranges. In some embodiments, height $H_3$ can be between about 20 nm and about 100 nm. Openings 1506 can be formed using a patterning and etching process. For example, a masking layer can be deposited on a top surface of backside ILD layer 1504 and a patterning process is performed to expose portions of backside ILD layer 1504 over source/drain region 110. An etching process can be used to remove the exposed portions of backside ILD layer 1504 until source/drain region 110 is exposed. The masking layer can be removed after the etching process.

Figure 16:
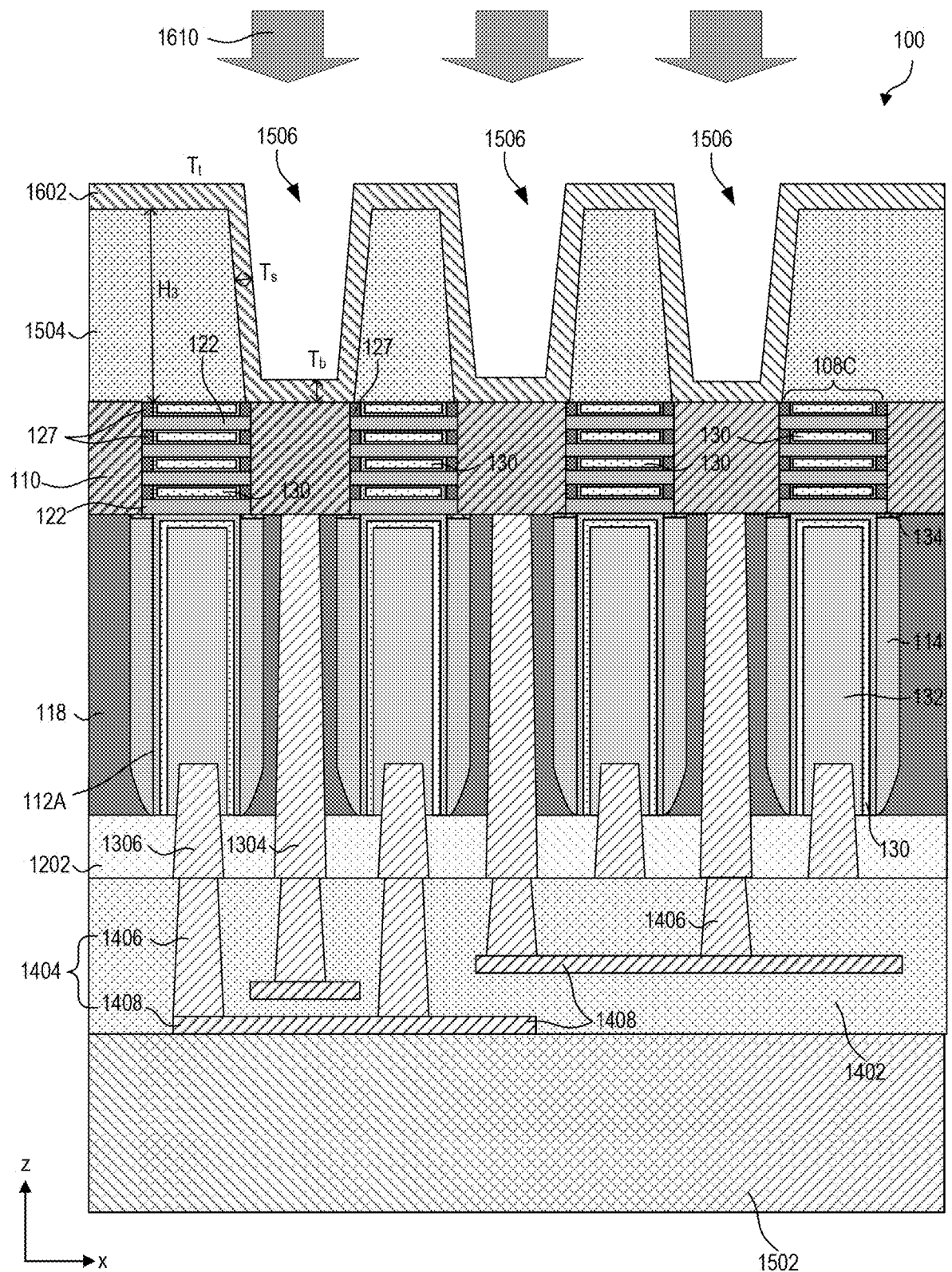

Referring to FIG. 2, in operation 265, a low-temperature liner layer is deposited in the openings, according to some embodiments. Referring to FIG. 16, a low-temperature liner material 1602 is blanket deposited on exposed surfaces. For example, low-temperature liner material 1602 can be deposited on sidewall and bottom surfaces in opening 1506 and also on top surface of backside ILD layer 1504. Low-temperature liner material 1602 can be formed using a silicon compound material that can provide high etch selectivity (e.g., between about 50 and about 100) against subsequent cleaning processes used to treat source/drain region 110. Cleaning processes, such as a pre-salicide cleaning, can be performed after low-temperature liner material 1602 is etched in subsequent fabrication steps and can use any suitable cleaning solutions, such as a fluoride-based cleaning solution. To provide high etch selectivity against the cleaning solution, the silicon compound material of low-temperature liner material 1602 can have a chemical formula of Si(X), where X can be one or more of carbon, nitrogen, oxygen, boron, or any suitable elements. For example, low-temperature liner material 1602 can be formed using silicon nitride, silicon carbon oxide, silicon carbon nitride, silicon boron carbon nitride, any suitable metal oxides, and/or combinations thereof. In some embodiments, low-temperature liner material 1602 can be formed with hafnium oxide, aluminum oxide, low-k dielectric material, or any suitable dielectric material.

Low-temperature liner material 1602 can be deposited using an ALD, PEALD, CVD, PECVD, any suitable deposition process, and/or combinations thereof. To prevent other structures from being damaged during the deposition process, the deposition temperature can be kept below about 500° C. For example, the deposition temperature during the deposition of low-temperature liner material 1602 can be between about 300° C. and about 400° C. In some embodiments, the deposition temperature can be between about 400° C. and about 500° C. The deposition process can use a multi-temperature process, such as starting the deposition process at about 300° C. and gradually increasing the deposition temperature to about 350° C. In some embodiments, the deposition temperature can be maintained at about 300° C. for the duration of the deposition process. The deposition process can proceed until a nominal thickness of low-temperature liner material 1602 is achieved. In some embodiments, low-temperature liner material 1602 can be formed using silicon nitride, and a deposition process for depositing silicon nitride material can be an ALD process using precursors, such as silane-based precursors, ammonia, nitrogen, any suitable precursors, and combinations thereof. In some embodiments, precursors, such as halosilane, can be used. In some embodiments, low-temperature liner material 1602 can be formed using a conformal deposition process, and top thickness $T_t$ of low-temperature liner material 1602 at the top surface of backside ILD layer 1504 can be substantially the same as its bottom thickness $T_b$ at the bottom of openings 1506 (e.g, at the top surface of source/drain region 110). Sidewall thickness $T_s$ of low-temperature liner material 1602 formed on the sidewalls of openings 1506 can be substantially the same as top and bottom thicknesses $T_t$ and $T_b$. In some embodiments, sidewall thickness $T_s$ can be equal to or less than top thickness $T_s$ or bottom thickness $T_b$. For example, sidewall thickness $T_s$ can be between about 0.5 nm and about 5 nm while top thickness $T_t$ or bottom thickness $T_b$ can be between about 5 nm and about 15 nm. In some embodiments, a ratio between sidewall thickness $T_s$ and top thickness $T_t$ or bottom thickness $T_b$ can be between about 0.3 and about 1. By increasing top thickness $T_t$, enhanced physical and chemical protection of over underlying layers, such as backside ILD layer 1504, can be achieved during fabrication processes, such as etching and cleaning processes.

A post-deposition treatment process 1610 can improve the quality of deposited low-temperature liner material 1602 and/or increase the X/Si ratio of low-temperature liner material 1602 formed using Si(X). Increasing the X/Si ratio can improve the etch selectivity of low-temperature liner material 1602 over oxide materials against cleaning solutions and/or wet/dry etchants. Increasing the X/Si ratio can be achieved by a post-deposition treatment, such as an annealing process and an implantation process. On the other hand, increasing the X/Si ratio can also increase the value of the dielectric constant of low-temperature liner material 1602. Therefore, the desire to achieve high etching selectivity should be balanced with the need and/or desire to maintain a low dielectric constant (e.g., lower than about 3.9). In some embodiments, the N/Si ratio of low-temperature liner material 1602 formed using silicon nitride can be enhanced from about 1.2 to between about 1.23 and about 1.63. For example, the N/Si ratio can be increased to between about 1.29 and about 1.40. In some embodiments, the N/Si ratio of low-temperature liner material 1602 can be between about 1.23 and about 1.63, between about 1.33 and about 1.53, or any suitable ranges. In some embodiments, N/Si ratio lower than about 1.23 can lead to low etching selectivity (e.g., lower than about 1:20) of low-temperature liner material 1602 over oxide material. In some embodiments, increasing the N/Si ratio to exceed the aforementioned ranges could lead to undesirable high dielectric constant (e.g., greater than about 3.9). In some embodiments, the post-deposition treatment can increase the N/Si ratio of low-temperature liner material 1602 by about 5% to about 20%. In some embodiments, post-deposition treatment process 1610 can be a low-temperature annealing process that includes annealing semiconductor structure 100 in a nitrogen environment and at a temperature below about 400° C. In some embodiments, the temperature of the deposition and post-deposition treatment can be between about 300° C. and about 350° C., between about 350° C. and about 400° C., or any other suitable temperature range. The deposition and treatment temperature can be kept below 400° C. such that other formed structures are not affected by high temperature. For example, using low temperature for the deposition and post-deposition treatments can prevent the copper material of interconnects 1404 from migrating, melting, or increase in resistivity. In some embodiments, an implantation process can be used to increase the X/Si ratio. For example, semiconductor structure 100 can be placed in an implantation apparatus, and energized ion beams including implant ions of nitrogen, boron, carbon, or any suitable implant ions can be driven into low-temperature liner material 1602 to increase the atomic ratio of the respective implant ions. In some embodiments, post-deposition treatment process 1610 can include ion implantation processes for increasing boron and/or carbon atomic content in the deposited low-temperature liner material 1602. In some embodiments, a boron to silicon atomic ratio (i.e., B/Si) after post-deposition treatment process 1610 can be between about 0.2 and about 2.8, between about 0.3 and about 2.4, between about 0.5 and about 2, between about 0.8 and about 1.6, or any other suitable ratio. In some embodiments, a carbon to silicon atomic ratio (i.e., C/Si) after post-deposition treatment process 1610 can be between about 0.1 and about 3.1, between about 0.15 and about 2.8, between about 0.2 and about 2.5, between about 0.4 and about 2.2, or any other suitable ratio. In some embodiments, B/Si and/or C/Si ratios lower than the aforementioned ratios can lead to low etching selectivity (e.g., lower than about 1:20) of low-temperature liner material 1602 over oxide material. In some embodiments, increasing the B/Si and/or C/Si ratios to exceed the aforementioned ranges could lead to undesirable high dielectric constant (e.g., greater than about 3.9). In some embodiments, one or more post-deposition processes can be used. For example, a nitrogen annealing process and an ion implantation process for implanting boron and/or carbon ions into low-temperature liner layer 1602 can all be performed. In some embodiments, the ion implantation process can be performed prior to an annealing process. In some embodiments, only the nitrogen anneal process is performed. In some embodiments, only the ion implantation process for boron and/or carbon is performed.

After the deposition and post-deposition treatment process, low-temperature liner material 1602 can be formed of a material that provides high etch selectivity (e.g., between about 50 and about 100) against various cleaning solutions and chemical etchants. For example, compared to backside ILD layer 1504 or native oxide layers that can be formed on exposed source/drain regions 110, low-temperature liner material 1602 can be etched at a lower etching rate when being exposed to cleaning solutions and chemical etchants. In some embodiments, the etch selectivity of oxide material over low-temperature liner material 1602 can be greater than about 12:1. Therefore, low-temperature material 1602 can protect underlying backside ILD layer 1504 and inner spacers 127 during cleaning and/or fabrication processes, such as a pre-silicide cleaning process on source/drain regions 110. In some embodiments, the etch resistance can depend on the choice of cleaning solutions and chemical etchants used in the cleaning processes and/or fabrication processes. In some embodiments, low-temperature liner material 1602 can be formed using silicon carbon nitride or silicon carbon oxide, with the silicon atomic content between about 10% and about 30%, the carbon atomic content between about 30% and about 50%, the oxygen or nitrogen atomic content between about 5% and about 10%. For example, the silicon atomic content of low-temperature liner material 1602 formed using silicon carbon nitride or silicon carbon oxide can be between about 10% and about 15%, between about 15% and about 30%, or any suitable range. The carbon atomic content of low-temperature liner material 1602 formed using silicon carbon nitride or silicon carbon oxide can be between about 30% and about 40%, between about 40% and about 50%, or any suitable range. The oxygen or nitride atomic content of low-temperature liner material 1602 formed using silicon carbon nitride or silicon carbon oxide can be between about 5% and about 7%, between about 7% and about 10%, or any suitable range. In some embodiments, low-temperature liner material 1602 can be formed using silicon nitride of which a nitride to silicon atomic ratio can be between about 1.30 and about 1.32. Increasing the nitrogen, carbon, boron, or oxygen atomic content can increase the etch selectivity of low-temperature liner material 1602 against the cleaning solutions used in the cleaning process. In some embodiments, having the atomic contents of nitrogen, carbon, boron, or oxygen lower or greater than the respective aforementioned ranges may lead to insufficient etch selectivity (e.g., lower than about 1:20) over oxide material against the cleaning solutions.

Figure 17:
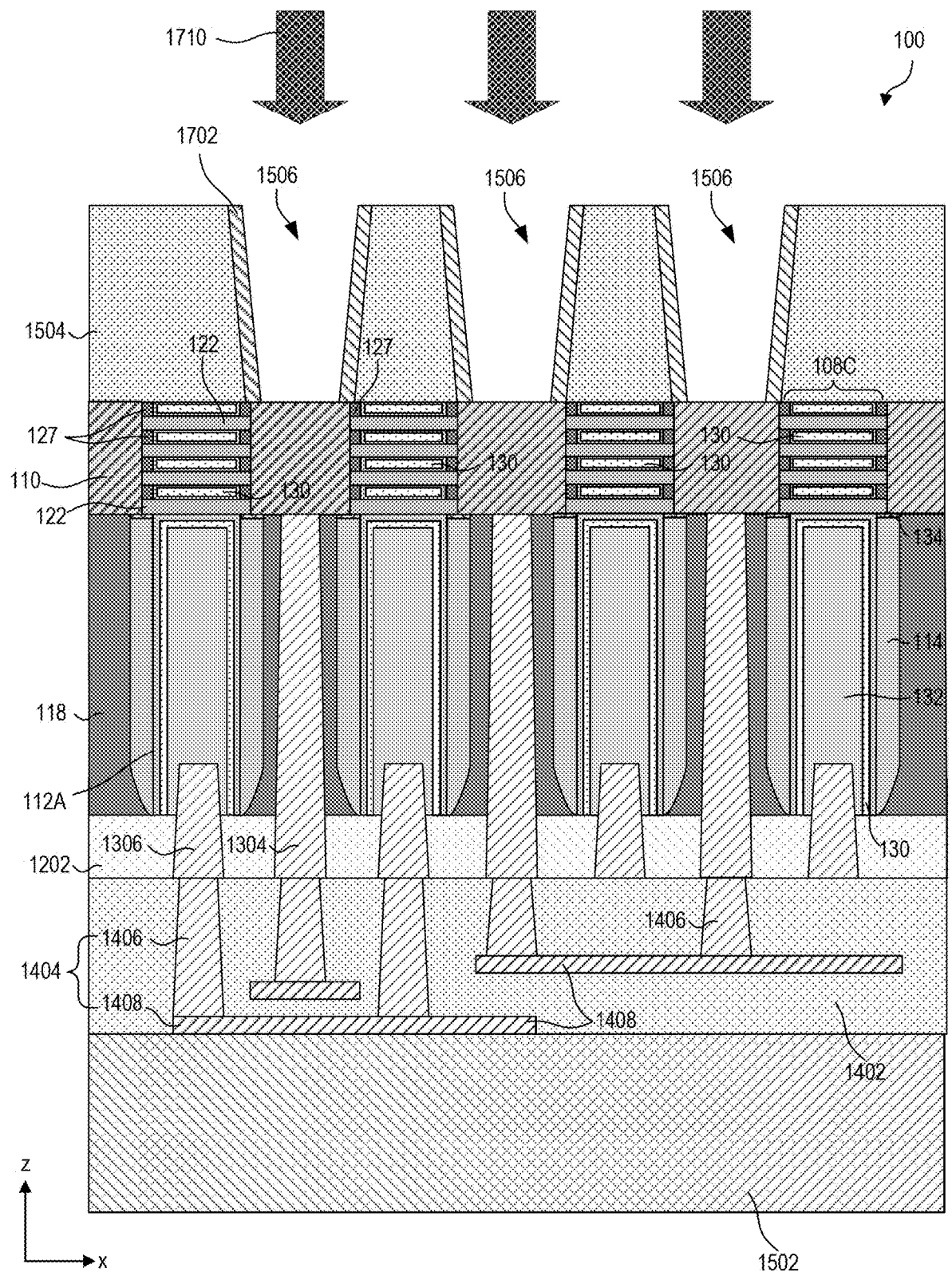

Referring to FIG. 2, in operation 270, a bottom portion of the low-temperature liner layer is removed and a cleaning process is performed, according to some embodiments. Referring to FIG. 17, a directional etching process 1710 can be performed to remove bottom portions of low-temperature liner material 1602 to form low-temperature liner layer 1702. After directional etching process 1710, source/drain regions 110 can be exposed through openings 1506 and low-temperature liner layer 1702 are formed on sidewalls of backside ILD layer 1504. Low-temperature liner material 1602 can protect backside ILD layer 1504 and inner spacers 127 from being damaged during directional etching process 1710. In some embodiments, low-temperature liner material 1602 formed on top surfaces of backside ILD layer 1504 can also be removed after directional etching process 1710. In some embodiments, portions of low-temperature liner material 1602 can remain on top surfaces of backside ILD layer 1504 to prevent backside ILD layer 1504 from being etched during directional etching process 1710. A planarization process, such as a CMP process, can remove the remaining low-temperature liner material 1602 from top surfaces of backside ILD layer 1504 after directional etching process 1710. In some embodiments, low-temperature liner layer 1702 can have a thickness between about 0.5 nm and about 5 nm. For example, low-temperature liner layer 1702 can have a thickness between about 0.5 nm and about 1 nm, between about 1 nm and about 3 nm, between about 3 nm and about 5 nm. Increasing the thickness of low-temperature liner layer 1702 can provide greater protection for underlying structures, such as inner spacers 127, against etching or cleaning processes.

Cleaning processes can be performed after directional etching process 1710 to prepare exposed source/drain region 110 for subsequent fabrication processes. In some embodiments, a fluoride-based cleaning solution can be flown into openings 1506 and remove native oxide material and/or other residue from top surfaces of source/drain regions 110. Low-temperature liner layer 1702 can act as a physical barrier layer and prevent inner spacers 127 from being in contact with the cleaning process. Low-temperature liner layer 1702 can also act as a barrier layer for preventing other fabrication processes from damaging its underlying structures.

Figure 18:
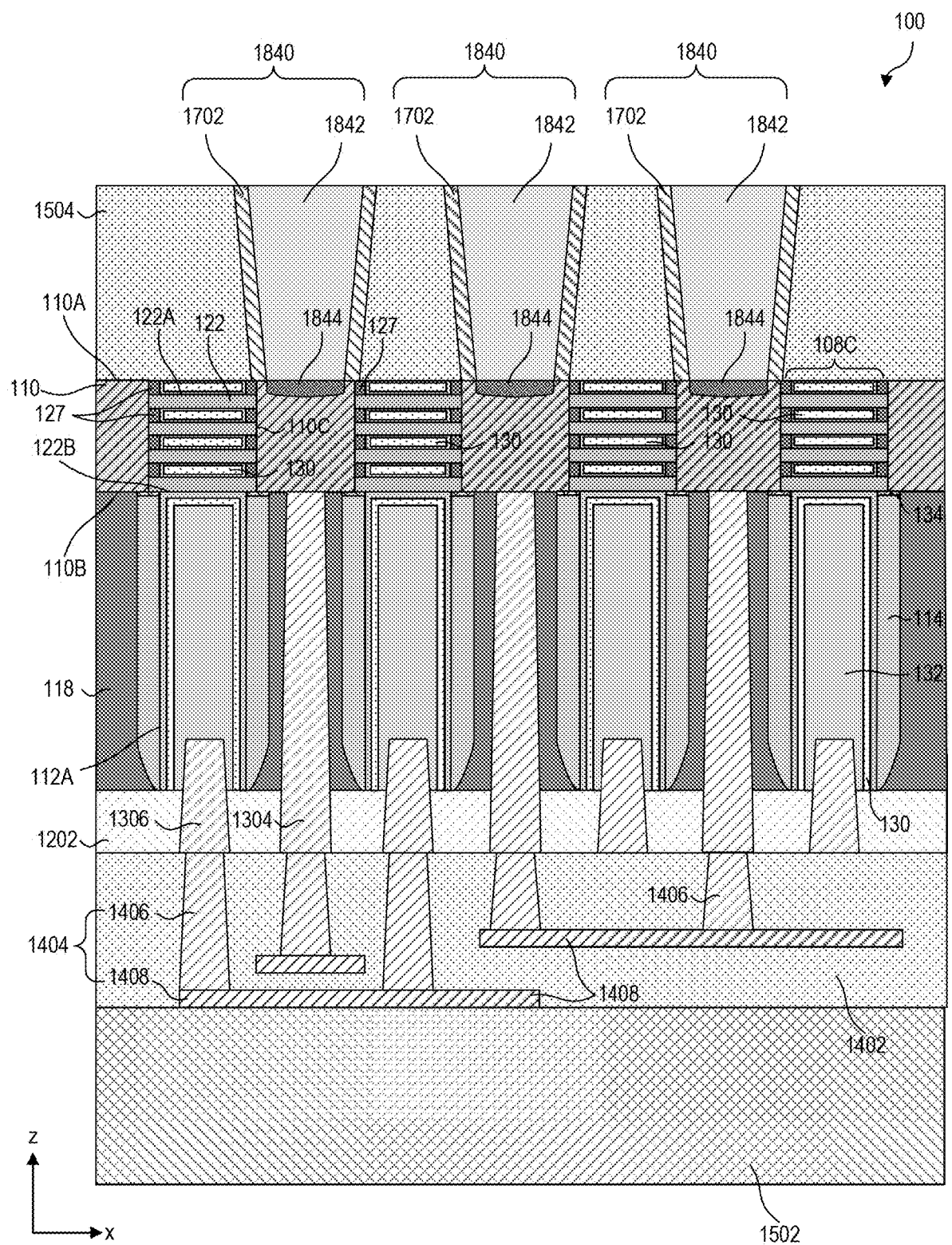

Referring to FIG. 2, in operation 275, conductive material is deposited to form salicide regions and conductive contacts, according to some embodiments. Referring to FIG. 18, salicide regions 1844 and be formed in source/drain region 110 and conductive contacts 1842 can be formed over salicide regions 1844. In some embodiments, salicide regions 1844 can be formed at a back surface 110A of source/drain regions 110 and source/drain contacts 1304 can be formed at a front surface 110B of source/drain regions 110. Back surface 110A and front surface 110B opposes each other and source/drain regions 110 further includes side surfaces 110C connecting back surface 110A and front surface 110B. In some embodiments, front surface 122B of semiconductor layer 122 in channel region 108C can be substantially coplanar with front surface 110B of source/drain region 110. In some embodiments, conductive contacts can be used as power rails that are electrically connected to a power supply level and supply power to source/drain regions 110 through the backside of semiconductor structure 100. For example, additional devices and structures (not illustrated) can be formed on backside ILD layer 1504 and connected to conductive contacts 1842. Salicide regions 1844 can be formed by depositing a layer of conductive material in openings 1506 and performing an annealing process. In some embodiments, the layer of conductive material can be the conductive material that forms conductive contacts 1842. In some embodiments, the layer of conductive material can be a thin film of metal that is removed after the annealing process. In some embodiments, salicide regions 1844 are self-aligned silicide region that can include ruthenium silicide, nickel silicide, cobalt silicide, tungsten silicide, tantalum silicide, titanium silicide, platinum silicide, erbium silicide, palladium silicide, any suitable silicide material, and/or combinations thereof. The annealing process of forming salicide regions 1844 can be performed at a temperature below about 400° C. to inhibit copper diffusion in already-formed interconnect structures and devices. For example, the annealing process of forming salicide regions 1844 can be performed at a temperature between about 300° C. and about 400° C. Conductive contacts 1842 can be formed by depositing a conductive material in openings 1506 of FIG. 17 until the openings 1506 are completely filled with the conductive material. In some embodiments, the conductive material of conductive contacts 1842 can include ruthenium, nickel, cobalt, tungsten, tantalum, titanium, platinum, erbium, palladium, copper, silver, aluminum, any suitable conductive material, and/or combinations thereof. In some embodiments, the conductive material of conductive contacts 1842 can be deposited using ALD, CVD, PECVD, PVD, electroplating, any suitable deposition methods, and/or combinations thereof. A planarization process can be performed such that top surfaces of salicide regions 1844, low-temperature liner layer 1702, and backside ILD layer 1504 can be substantially coplanar. After the deposition of conductive material, vertical (e.g., z direction) sidewalls of conductive contacts 1842 can be surrounded by low-temperature liner layer 1702. Conductive contacts 1842 and low-temperature liner layer 1702 can form backside contacts 1840.

Figure 19:
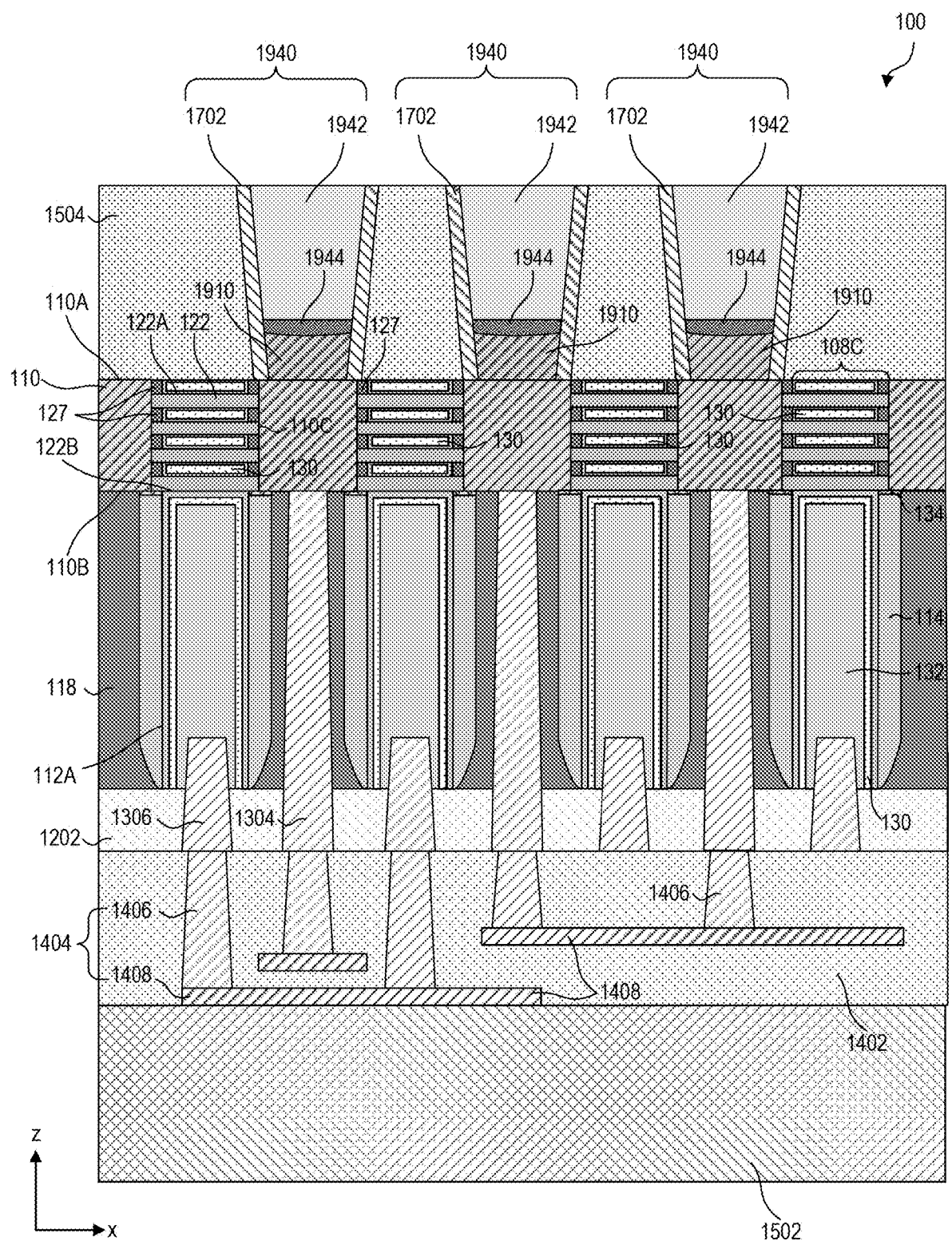
FIGS. 19 and 20 are various views of semiconductor devices having low-temperature liner layers, in accordance with some embodiments.
Figure 20:
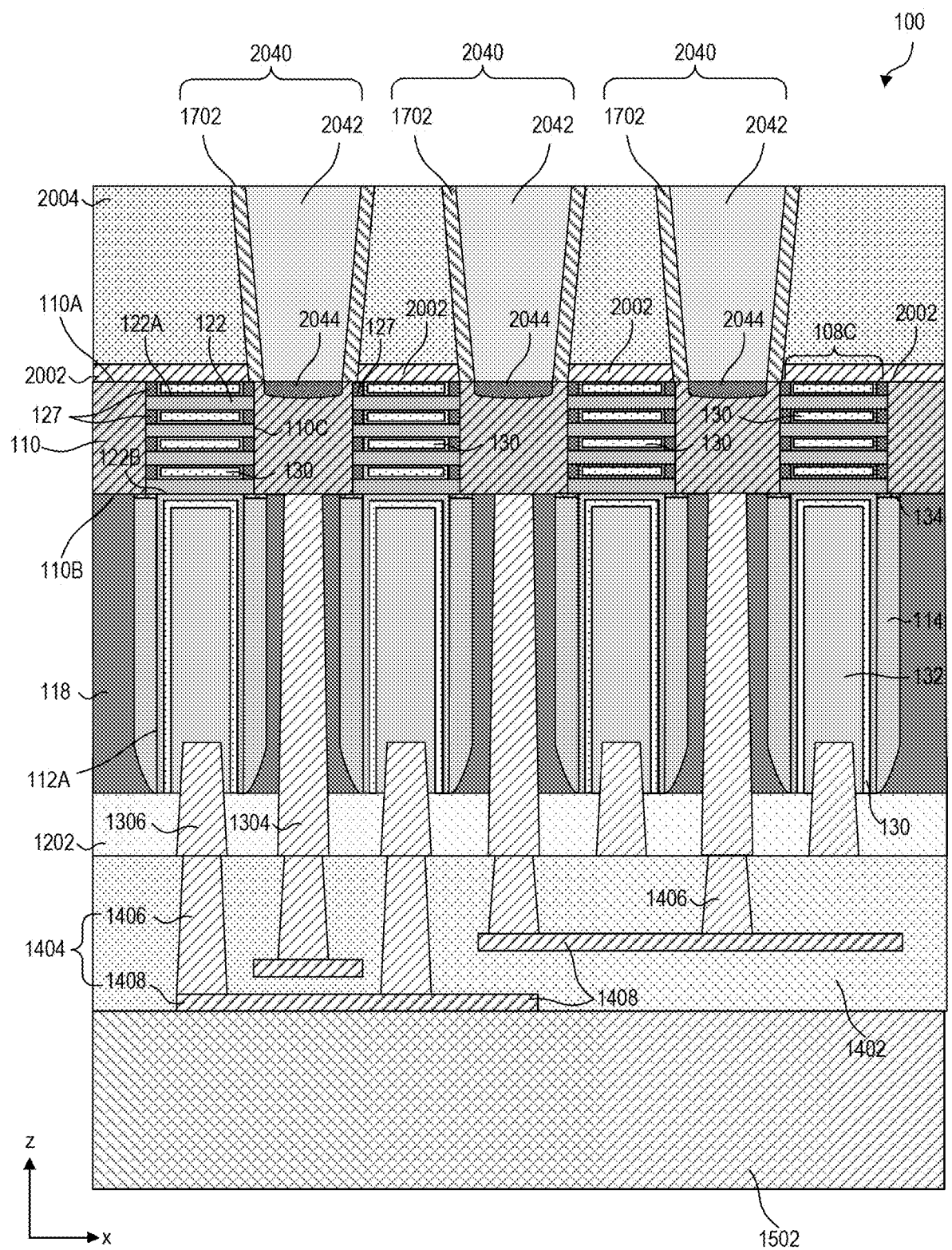

FIGS. 19 and 20 illustrate exemplary semiconductor structures incorporating low-temperature liner layers, according to some embodiments. Elements in FIGS. 19 and 20 that are respectively similar to those of FIGS. 16-18 are labelled with the same annotations and not described in detail herein for simplicity.

FIG. 19 illustrates an exemplary semiconductor structure incorporating a low-temperature liner layer and an additional epitaxial region in contact with the low-temperature liner layer, according to some embodiments. As shown in FIG. 19, epitaxial region 1910 can be formed on source/drain region 110, and salicide region 1944 can be formed in epitaxial region 1910. Epitaxial region 1910 can be formed in contact with back surface 110A of source/drain region 110 and source/drain contacts 1304 can be formed in contact with front surface 110B of source/drain region 110. In some embodiments, epitaxial region 1910 can be formed after an opening that is similar to opening 1506 has been formed to expose source/drain region 110. Epitaxial region 1910 can be formed by epitaxially growing a crystalline material using source/drain region 110 as a seed layer. For example, source/drain region 110 formed using single crystalline silicon can be used as a seed layer to initiate an epitaxial growth of silicon material to form epitaxial region 1910. Salicide region 1944 and conductive contact 1942 can be formed using materials and methods similar to those of salicide region 1844 and conductive contact 1842 of FIG. 18, and are not described in detail herein for simplicity. Conductive contact 1942 and low-temperature liner layer 1702 can form backside contacts 1940.

FIG. 20 illustrates an exemplary semiconductor structure incorporating a low-temperature liner layer and an additional low-temperature liner layer in contact with the backside dielectric layer, according to some embodiments. As shown in FIG. 20, in addition to low-temperature liner layer 1702, another low-temperature liner layer 2002 can be formed between backside dielectric layer 2004 and source/drain regions 110, and also formed between backside dielectric layer 2004 and semiconductor layer 122. Low-temperature liner layer 2002 can be formed in contact with back surface 110A of source/drain region 110 and source/drain contacts 1304 can be formed in contact with front surface 110B of source/drain region 110. The additional low-temperature liner layer 2002 can be formed after the wafer thinning process described in FIG. 15. In some embodiments, low-temperature liner layer 2002 can be formed using a deposition and post-deposition process that is similar to those of low-temperature liner layer 1702 described in FIG. 17. Backside dielectric layer 2004 can be deposited on low-temperature liner layer 2002 using deposition method similar to that of backside ILD layer 1504 described in FIG. 15. Salicide regions 2044 and conductive contact 2042 can be formed methods similar to those described in FIG. 18. In some embodiments, forming salicide regions 2044 can include (i) patterning and etching openings in backside dielectric layer 2002; (ii) extending the openings by etching low-temperature liner layer 2002 to expose source/drain regions 110; (iii) depositing a low-temperature liner material in the openings and performing a post-deposition treatment process; (iv) performing a directional etching process to remove portions of the low-temperature liner formed at the bottom of the openings; (v) depositing a conductive material in the openings to form conductive contacts 2042 and performing an anneal process to form salicide regions 2044; and (vi) performing a planarization process such that top surfaces of backside dielectric layer 2004 and conductive contact 2042 can be substantially coplanar. Salicide region 2044 and conductive contact 2042 can be formed using materials and methods similar to those of salicide region 1844 and conductive contact 1842 of FIG. 18, and are not described in detail herein for simplicity. Conductive contact 2042 and low-temperature liner layer 1702 can form backside contacts 2040. Carrier wafer 1502 described in FIGS. 15-20 can be removed such that additional interconnects and/or semiconductor devices can be formed and connected to interconnects 1404. Carrier wafer 1502 can be removed by any suitable methods, such as backside grinding, CMP polishing, wet etching, dry etching, and combinations thereof.

Various embodiments in the present disclosure describe methods for forming low-temperature liner layers for backside contacts in semiconductor devices. Liner layers can protect exposed structures that are in the openings during etching or cleaning processes. Liner layers can also prevent leakage current between gate structures and source/drain terminals. Liner layers can be formed using a low-temperature deposition method (e.g., between about 300° C. and about 400° C.) to preserve thermal budget and avoid damaging existing structures, such as already-formed MEOL and BEOL structures. Low-temperature liner layers described herein provide various benefits that can improve device performance, reliability, and yield.

In some embodiments, a semiconductor device includes a transistor. The transistor includes a source/drain region that includes a front surface and a back surface opposite to the front surface. The transistor includes a salicide region on the back surface and a channel region in contact with the source/drain region. The channel region has a front surface co-planar with the front surface of the source/drain region. The transistor further includes a gate structure disposed on a front surface of the channel region. The semiconductor device also includes a backside contact structure that includes a conductive contact in contact with the salicide region and a liner layer surrounding the conductive contact.

In some embodiments, a semiconductor device includes a gate-all-around field effect transistor (GAA FET). The GAA FET includes a plurality of nanowires, wherein a nanowire of the plurality of nanowires has a front surface. The GAA FET also includes a gate dielectric layer wrapping around each nanowire of the plurality of nanowires, wherein the gate dielectric layer is in contact with the front surface of the nanowire. The GAA FET also includes a gate electrode disposed on the gate dielectric layer and over the front surface of the nanowire. The GAA further includes a source/drain region in contact with the plurality of nanowires and has a front surface and a back surface. The front surface of the source/drain region is opposite to the back surface and co-planar with the front surface of the nanowire. The semiconductor device also includes a backside interlayer dielectric (ILD) layer and a backside contact in the backside ILD layer. The backside contact includes an epitaxial region in contact with a back surface of the source/drain region and a salicide layer in contact with the epitaxial region. The backside contact also includes a conductive contact in contact with the salicide layer and a liner layer (1702) between the conductive contact and the ILD layer. The liner layer is in contact with the back surface of the source/drain region. The backside contact also includes a source/drain contact in contact with the front surface of the source/drain region.

In some embodiments, a method includes forming a transistor on a substrate. Forming the transistor includes forming a source/drain region at a front surface of the substrate and forming a channel region at the front surface of the substrate. The method also includes forming a gate electrode on the channel region. The method further includes depositing an interlayer dielectric (ILD) layer over the transistor and forming a source/drain contact through the ILD layer and in contact with a front surface of the source/drain region. The method also includes forming interconnects over the source/drain contacts and the gate electrode and performing a wafer thinning process on the substrate from a back surface of the substrate. The method further includes depositing a backside ILD layer on the back surface of the substrate, wherein the front and back surfaces of the substrate are opposite to each other. The method also includes etching the backside ILD to form an opening to expose a back surface of the source/drain region and forming a liner layer in the opening. The liner layer is formed on sidewalls of the backside ILD layer in the opening and in contact with the exposed back surface of the source/drain region. The method further includes depositing a conductive material in the opening to form a conductive contact.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a transistor, comprising:
   a source/drain region, comprising:
   a front surface and a back surface opposite to the front surface; and a salicide region on the back surface;
   a channel region in contact with the source/drain region and comprising a front surface co-planar with the front surface of the source/drain region; and
   a gate structure disposed on the front surface of the channel region; and
   a backside contact structure, comprising:
   a conductive contact in contact with the salicide region; and
   a liner layer surrounding the conductive contact, wherein a horizontal interface between the liner layer and the source/drain region is coplanar with a horizontal interface between the salicide region and the conductive contact.

2. The semiconductor device of claim 1, wherein the channel region comprises a stack of nanowires in contact with the source/drain region.

3. The semiconductor device of claim 2, further comprising:
   a gate dielectric layer wrapped around a nanowire of the stack of nanowires; and
   a spacer in contact with the nanowire and the gate dielectric layer.

4. The semiconductor device of claim 3, wherein the liner layer is in contact with the spacer.

5. The semiconductor device of claim 3, further comprising a backside dielectric layer in contact with the gate dielectric layer and the liner layer.

6. The semiconductor device of claim 5, wherein the liner layer is in contact with the source/drain region.

7. The semiconductor device of claim 1, wherein the liner layer comprises silicon nitride material having an atomic content ratio of nitrogen over silicon between about 1.30 and about 1.33.

8. The semiconductor device of claim 1, wherein the liner layer comprises silicon carbon nitride having a silicon atomic content between about 10% and about 30%, a carbon atomic content between about 30% and about 50%, and a nitrogen atomic content between about 5% and about 10%.

9. The semiconductor device of claim 1, wherein the liner layer comprises silicon carbon oxide having a silicon atomic content between about 10% and about 30%, a carbon atomic content between about 30% and about 50%, and an oxygen atomic content between about 5% and about 10%.

10. The semiconductor device of claim 1, wherein the liner layer comprises aluminum oxide, hafnium oxide, or silicon boron carbon nitride.

11. A semiconductor device, comprising:
    a gate-all-around field effect transistor (GAA FET), comprising:
    a plurality of nanowires, wherein a nanowire of the plurality of nanowires comprises a front surface;
    a gate dielectric layer wrapping around each nanowire of the plurality of nanowires,
    wherein the gate dielectric layer is in contact with the front surface of the nanowire;
    a gate electrode disposed on the gate dielectric layer and over the front surface of the nanowire; and
    a source/drain (S/D) region in contact with the plurality of nanowires and comprising a front surface and a back surface, wherein the front surface of the S/D region is opposite to the back surface and co-planar with the front surface of the nanowire;
a backside interlayer dielectric (ILD) layer;
a backside contact in the backside ILD layer and comprising:
a salicide layer in contact with a first portion of the back surface of the S/D region;
a conductive contact in contact with the salicide layer; and
a liner layer between the conductive contact and the ILD layer, wherein the liner layer is in contact with a second portion of the back surface of the S/D region, wherein a bottom surface of the liner layer is coplanar with a top surface of the salicide layer; and
an S/D contact in contact with the front surface of the S/D region.

12. The semiconductor device of claim 11, further comprising a spacer in contact with the nanowire, the liner layer, and the gate dielectric layer.

13. The semiconductor device of claim 11, wherein the liner layer surrounds the conductive contact.

14. The semiconductor device of claim 11, further comprising a plurality of spacers, wherein a spacer of the plurality of spacers is in contact with the liner layer and the nanowire of the plurality of nanowires.

15. The semiconductor device of claim 14, wherein the spacer is in contact with the gate dielectric layer.

16. A semiconductor device, comprising:
a channel region on a substrate;
a gate structure surrounding the channel region;
a source/drain (S/D) region on the substrate and abutting the channel region;
a salicide region having a horizontal bottom surface coplanar with a bottom surface of the gate structure;
a conductive contact on the horizontal bottom surface of the salicide region; and
a liner layer on a side surface of the conductive contact.

17. The semiconductor device of claim 16, further comprising a spacer between the gate structure and the S/D region.

18. The semiconductor device of claim 16, further comprising a spacer between the liner layer and the channel region.

19. The semiconductor device of claim 16, wherein the liner layer is in contact with the S/D region.

20. The semiconductor device of claim 16, wherein an interface between the salicide region and the S/D region is curved.

* * * * *